(12) United States Patent
Sugibayashi et al.

(10) Patent No.: US 7,099,184 B2
(45) Date of Patent: Aug. 29, 2006

(54) MAGNETIC RANDOM ACCESS MEMORY

(75) Inventors: Tadahiko Sugibayashi, Tokyo (JP);
Takeshi Honda, Tokyo (JP); Noboru Sakimura, Tokyo (JP); Hisao Matsutera, Tokyo (JP); Atsushi Kamijo, Tokyo (JP); Kenichi Shimura, Tokyo (JP); Kaoru Mori, Tokyo (JP)

(73) Assignee: NEC Corporation, Tokyo (JP)

( * ) Notice: Subject to any disclaimer, the term of this patent is extended or adjusted under 35 U.S.C. 154(b) by 15 days.

(21) Appl. No.: 10/523,198

(22) PCT Filed: Jul. 28, 2003

(86) PCT No.: PCT/JP03/09547

§ 371 (c)(1),
(2), (4) Date: Jan. 27, 2005

(87) PCT Pub. No.: WO2004/012199

PCT Pub. Date: Feb. 5, 2004

(65) Prior Publication Data
US 2006/0098477 A1 May 11, 2006

(30) Foreign Application Priority Data
Jul. 29, 2002 (JP) ............................. 2002-220161

(51) Int. Cl.
*G11C 11/00* (2006.01)
*G11C 17/00* (2006.01)

(52) U.S. Cl. ...................... 365/158; 365/97; 365/55; 365/100

(58) Field of Classification Search .................... None
See application file for complete search history.

(56) References Cited

U.S. PATENT DOCUMENTS

| 5,640,343 | A | 6/1997 | Gallagher et al. |
| 6,191,989 | B1* | 2/2001 | Luk et al. .................. 365/207 |

FOREIGN PATENT DOCUMENTS

| JP | 2000-82791 A | 10/2001 |
| JP | 2001-273760 | 10/2001 |
| JP | 2002-008367 | 1/2002 |
| JP | 2002-100181 | 4/2002 |
| JP | 2002-110938 | 4/2002 |
| JP | 2002-140889 | 5/2002 |
| JP | 2002-230965 | 8/2002 |
| JP | 2002-246568 | 8/2002 |
| JP | 2002-334973 | 11/2002 |
| JP | 2003-31773 | 1/2003 |

OTHER PUBLICATIONS

Office Action issued by Japanese Patent Office, Japanese Patent Application No. 2003-397854, dated Dec. 12, 2005 (with English translation of relevant sections).

* cited by examiner

*Primary Examiner*—Thong Q. Le
(74) *Attorney, Agent, or Firm*—Michael Best & Friedrich LLP

(57) ABSTRACT

An improved magnetic random access memory (MRAM) has two sets of signal lines where each set is substantially perpendicular to the other, and memory cells located at the intersections of the signal lines. Each memory cell has a magneto-resistant element containing a magnetization layer whose magnetic characteristics change depending on the intensity of the magnetic field applied. A desired magnetic field can be applied to any cell by supplying appropriate write currents to the signal lines intersecting at that cell. The relationship between applied magnetic fields, two different threshold function values, and four different magnetic fields that result at each cell is disclosed. Better performance, namely, improved selectivity and a more stable write operation, results.

32 Claims, 25 Drawing Sheets

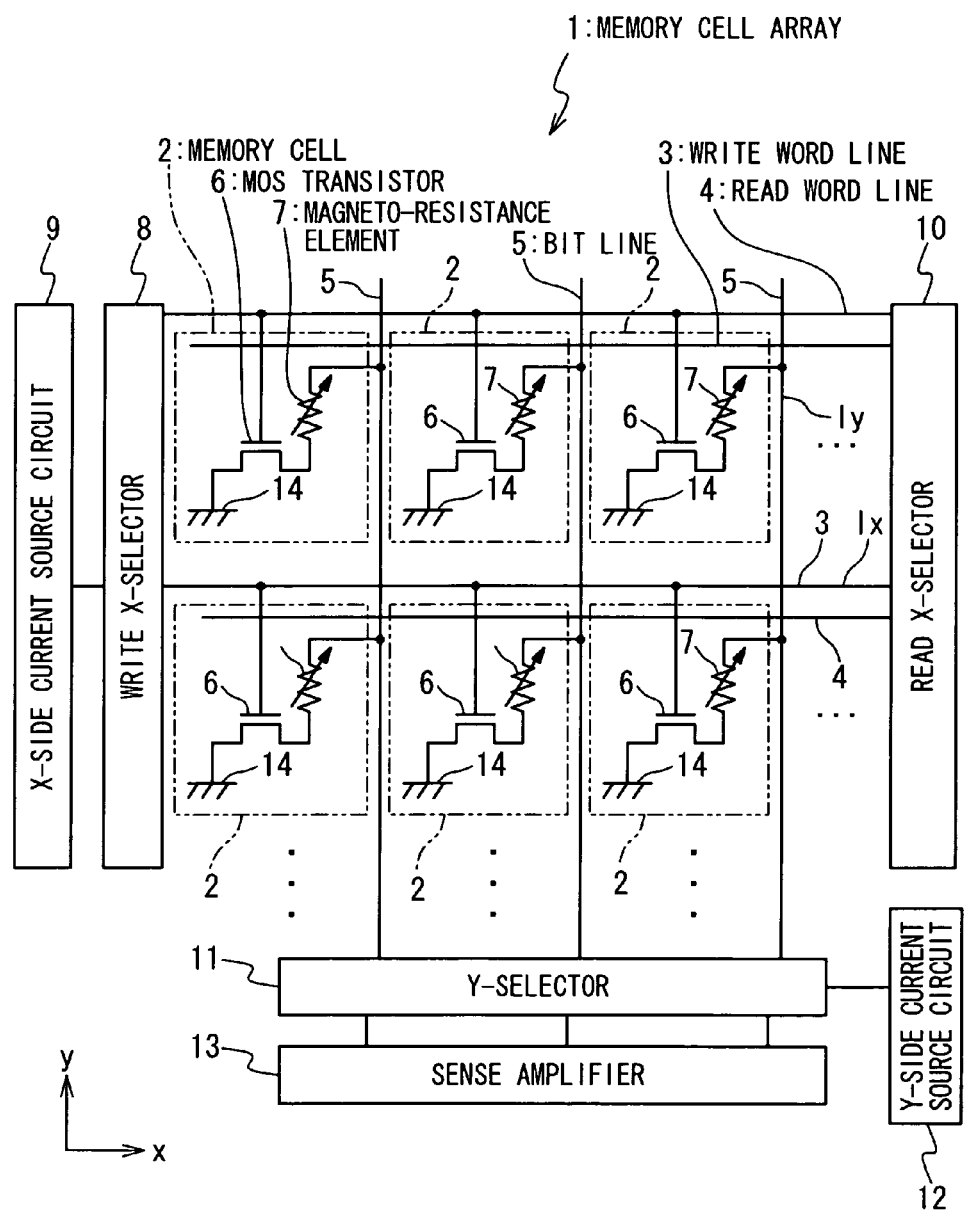

SELECTED CELL

NON-SELECTED CELL CONNECTED WITH SELECTED BIT LINE AND NON-SELECTED WORD LINE

NON-SELECTED CELL CONNECTED WITH NON-SELECTED BIT LINE AND SELECTED WORD LINE

MAGNETIZATION CHARACTERISTIC IN HARD AXIS DIRECTION

MAGNETIZATION CHARACTERISTIC IN EASY AXIS DIRECTION

MAGNETIZATION CHARACTERISTIC IN MIDDLE AXIS DIRECTION

SELECTED CELL

NON-SELECTED CELL CONNECTED WITH SELECTED BIT LINE AND NON-SELECTED WORD LINE

NON-SELECTED CELL CONNECTED WITH NON-SELECTED BIT LINE AND SELECTED WORD LINE

SELECTED CELL

NON-SELECTED CELL CONNECTED
WITH SELECTED BIT LINE
AND NON-SELECTED WORD LINE

NON-SELECTED CELL CONNECTED
WITH NON-SELECTED BIT LINE
AND SELECTED WORD LINE

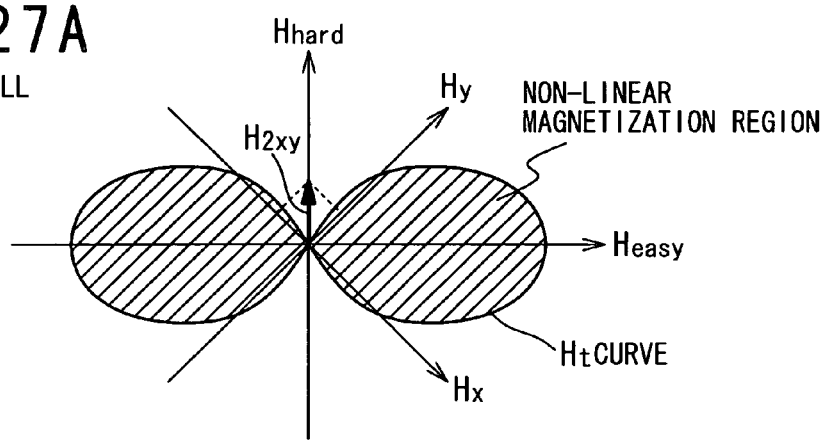
Fig. 27A SELECTED CELL
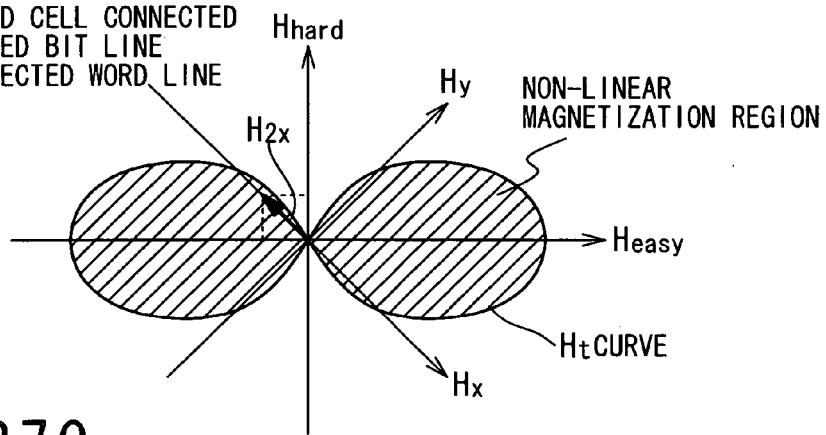
Fig. 27B NON-SELECTED CELL CONNECTED WITH SELECTED BIT LINE AND NON-SELECTED WORD LINE
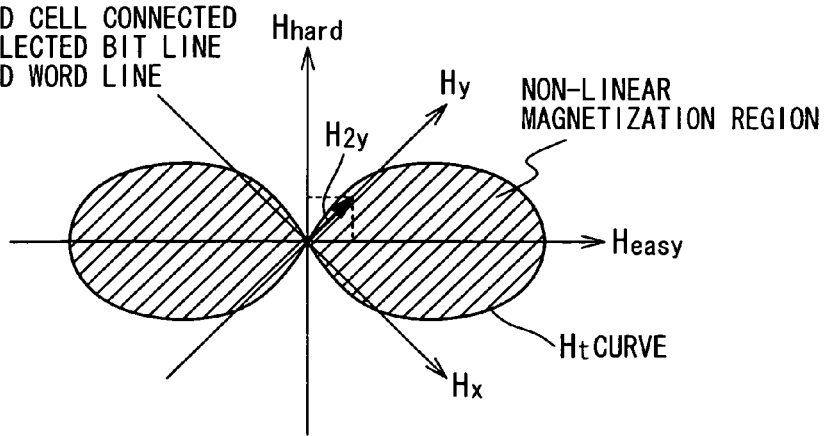
Fig. 27C NON-SELECTED CELL CONNECTED WITH NON-SELECTED BIT LINE AND SELECTED WORD LINE

MAGNETIC RANDOM ACCESS MEMORY

This application claims the benefit of International Patent Application No. PCT/JP03/09547 filed Jul. 28, 2003, which claims priority of Japanese Patent Application No. 220161/2002, filed Jul. 29, 2002.

FIELD OF INVENTION

The present invention relates to a magnetic random access memory.

BACKGROUND ART

A magnetic random access memory (MRAM) collects attention as a nonvolatile memory in which a high-speed write operation can be carried out and the number of times of rewrite is large.

FIG. 1 shows a typical MRAM disclosed in U.S. Pat. No. 5,640,343. The MRAM contains a memory cell array in which memory cells 101 are arranged in a matrix. The memory cell 101 is interposed between a word line 102 extending in an X axis direction (word line direction), and a bit line 103 extending in a Y axis direction (bit line direction).

As shown in FIGS. 2A and 2B, each memory cell 101 contains a magneto-resistance element (spin valve). The magneto-resistance element has a pinned layer 104 and a free layer 105 which are made of ferromagnetic material, and a non-magnetic spacer layer 106 interposed between the pinned layer 104 and the free layer 105. The pinned layer 104 may be connected to a diode 107 in order to apply a desired bias to the memory cell 101. When the non-magnetic spacer layer 106 is a very thin insulating layer, the magneto-resistance element is sometimes called MTJ (Magnetic Tunnel Junction). Both the pinned layer 104 and the free layer 105 which are formed of the ferromagnetic material have spontaneous magnetizations (residual magnetization). The direction of the spontaneous magnetization of the pinned layer 104 is fixed in the +X direction, and the direction of the spontaneous magnetization of the free layer 105 can be freely reversed in the +X direction or a -X direction. Anisotropy is given to the free layer 105, and the free layer 105 is formed in such a manner that the direction of the spontaneous magnetization is easily directed to the X-axis direction.

The memory cell 101 stores a 1-bit data as the direction of the spontaneous magnetization of the free layer 105. The memory cell 101 can take two states of a "parallel" state in which the direction of the spontaneous magnetization of the pinned layer 104 is identical to that of the spontaneous magnetization of the free layer 105, and an "anti-parallel" state in which the direction of the spontaneous magnetization of the pinned layer 104 is opposite to that of the spontaneous magnetization of the free layer 105. The memory cell 101 stores the 1-bit data regarding one of the "parallel" state and the "anti-parallel" state as "0" and the other as "1".

The data is read from the memory cell 101 by detecting the change of resistance of the memory cell 101 due to magnetic resistance effect. The directions of the spontaneous magnetizations of the pinned layer 104 and free layer 105 affects the resistance of the memory cell 101 through the magnetic resistance effect. When the direction of the spontaneous magnetization of the pinned layer 104 is parallel to that of the spontaneous magnetization of the free layer 105, the resistance of the memory cell 101 is a first value R (FIG. 2B). When the direction of the spontaneous magnetization of the pinned layer 104 is anti-parallel to that of the spontaneous magnetization of the free layer 105, the resistance is a second value R+ΔR (FIG. 2A). Therefore, the data stored in the memory cell can be detected by detecting the resistance of the memory cell 101.

The write operation of the data is carried out in a selected memory cell among the plurality of memory cells 101 through the following process. With reference to FIG. 1, one of the word lines 102 relating to the selected memory cell is selected as a selected word line, and one of the bit lines 103 relating to the selected memory cell is selected as a selected bit line. Currents flow through the selected word line and the selected bit line, and the spontaneous magnetization of the free layer 105 of the selected memory cell is directed to a desired direction based on a synthetic magnetic field of a magnetic field generated by the selected word line and a magnetic field generated by the selected bit line.

The role of the magnetic field generated by the selected bit line is different from that of the magnetic field generated by the selected word line. The magnetic field generated by the selected bit line determines the direction of the spontaneous magnetization of the free layer 105 of the selected memory cell. When the current flows through the selected bit line extending in the Y-axis direction, the magnetic field is generated in the +X direction or the -X direction, and the direction of the spontaneous magnetization of the free layer 105 of the selected memory cell is changed in the +X direction or the -X direction by the magnetic field. A magnetic field is not applied to the memory cell 101 which is not connected to the selected bit line and the direction of the spontaneous magnetization of the free layer 105 is not reversed. Therefore, the direction of the spontaneous magnetization of the free layer 105 in each memory cell with which the selected bit line does not intersect is saved.

On the other hand, the magnetic field generated by the selected word line makes it easy that the direction of the spontaneous magnetization of the free layer 105 of the selected memory cell is reversed. The direction of the magnetic field generated by the selected word line is the +Y direction or a -Y direction, and is a direction perpendicular to the direction in which the spontaneous magnetization of the free layer 105 can is directed. Therefore, the magnetic field generated by the selected word line does not determine the direction of the spontaneous magnetization of the free layer 105 directly. However, the ferromagnetic material of the free layer 105 is made easy in the reversion of the direction of the spontaneous magnetization by applying the magnetic field into the direction perpendicular to the direction of the spontaneous magnetization. The magnetic field generated by the selected word line is directed into the direction perpendicular to the direction of the spontaneous magnetization of the free layer 105, and therefore, the coercive force of the free layer 105 of the selected memory cell is reduced.

On the other hand, the magnetic field generated by the selected word line is not applied to non-selected memory cells of the memory cells 101 connected to the selected bit line. Therefore, the coercive force of the free layer 105 of the non-selected memory cell is not reduced. This means that the difference in the coercive force of the free layer 105 exists between the selected memory cell and the non-selected memory cell. The data can be selectively written in the selected memory cell based on the difference of the coercive force between the selected memory cell and non-selected memory cell.

FIGS. 3A to 3C show the principle of selective data write into the selected memory cell described above. The coercive force of the free layer 105 shows a characteristic called an asteroid curve (magnetization reversing magnetic field curve). This functions as a threshold function. When a magnetic field in the outside region of the asteroid curve is applied, the magnetic field exceeds the coercive force, and therefore, the direction of the spontaneous magnetization of the free layer 105 is reversed. The asteroid curves shown in FIGS. 3A to 3C show that the direction of the spontaneous magnetization of the free layer 105 is most easily reversed when a synthetic magnetic field directing the direction of 45 degrees to both the X axis and the Y axis directions is applied to the free layer 105 by the selected bit line and the selected word line.

The currents flowing through the selected bit line and the selected word line are selected in such a manner that the synthetic magnetic field of the magnetic fields generated by the selected bit line and the selected word line is located in the outside region of the asteroid curve, and each of the magnetic fields generated by the selected bit line and the selected word line is independently located in the outside region of the asteroid curve. The selection of the currents flowing through the selected bit line and the selected word line permits the selective write operation of the data into the selected memory cell.

One of the technical problems in the above-mentioned write operation of the data in the MRAM is power consumption. As described above, the write operation of the data into the MRAM is carried out by reversing the direction of the spontaneous magnetization by using the magnetic fields generated by the currents. For this reason, a relatively large current are required. The large currents increase the power consumption in the write operation of the data into the MRAM.

An MRAM in which the power consumption in the write operation of the data is reduced is disclosed in Japanese Laid Open Patent Application (JP-P2001-273760A). The MRAM is provided with a high permeability layer formed of high permeability material on the upper surface or lower surface of a write current path. The high permeability layer centralizes the magnetic field generated by the current path on the memory cell, and effectively suppresses the power consumption in the write operation of data.

Another MRAM in which the power consumption in the write operation of data is reduced is disclosed in Japanese Laid Open Patent Application (JP-P2002-110938A). The MRAM of this conventional example is provided with a magnetic film formed on the upper surface and side surfaces of the word line, and a magnetic film formed on the bottom surface and side surfaces of the bit line. The magnetic film is formed of high saturation magnetization soft magnetic material or metal-non-metal nanogranular material. The magnetic film allows the magnetic field to effectively act on the memory cell, and suppresses the power consumption at the time of the write operation of data effectively.

Another technical problem in the write operation of the data in the MRAM is selectivity of the selected memory cell. As described above, the write operation in the selected memory cell is realized in the MRAM by optimally selecting the magnitudes of the write currents flowing through the selected bit line and the selected word line according to the shape of the asteroid curve of the free layer. Therefore, the write currents flowing through the selected bit line and the selected word line, and the asteroid curve of the free layer must be adjusted in a high precision. However, it is hard to avoid changes of the write currents flowing through the selected bit line and the selected word line and the asteroid curve because of a variation in a manufacturing process and a variation in use environment of the MRAM. The changes degrade the selectivity of the selected memory cell, and a malfunction may be caused in which an undesired data is written in the non-selected memory cell in the write operation of data.

In conjunction with the above description, a magnetic random access memory is disclosed in Japanese Laid Open Patent Application (JP-P2002-8367A). In this conventional example, the magnetic random access memory has a plurality of sense lines and a plurality of word lines, and a unit memory cell is arranged at each of the intersections of the sense lines and the word lines in a two-dimensional array. The unit memory cell has a series connection of a cell selection switch provided with a function of a voltage drop element and a magneto-resistance element. Each of the sense lines is provided with a capacitance section, and electric charge stored in the capacitance section is sequentially discharged through the sense line, the cell selection switch, and the magneto-resistance element. Thus, a magnetic holding state of the magneto-resistance element is distinguished based on the voltage change of the capacitance section caused due to the discharge.

DISCLOSURE OF INVENTION

An object of the present invention is to provide a magnetic random access memory in which the selectivity of a memory cell can be improved and a write operation can be stabilized.

Another object of the present invention is to provide a magnetic random access memory in which the selectivity of a memory cell is improved by providing a ferri-magnetic laminate structure for each memory cell.

Still another object of the present invention is to provide a magnetic random access memory in which the selectivity of a memory cell can be improved by adjusting the film thickness of a non-magnetic layer in a ferri-magnetic laminate structure.

In a first aspect of the present invention, a magnetic random access memory is composed of a plurality of first signal lines provided to extend in a first direction, a plurality of second signal lines provided to extend in a second direction substantially perpendicular to the first direction, a plurality of memory cells respectively provided at the intersections of the plurality of first signal lines and the plurality of second signal lines, and a plurality of magnetic structures respectively provided to the plurality of memory cells. Each of the plurality of memory cells has a magneto-resistance element containing a spontaneous magnetization layer which has a first threshold function, and the direction of the spontaneous magnetization of the spontaneous magnetization layer is reversible when an element applied magnetic field having the intensity equal to or larger than a first threshold function value is applied. Each of the plurality of magnetic structures has a second threshold function, and generates a magnetic structure magnetic field in response to a structure-applied magnetic field. When the structure applied magnetic field equal to or larger than the second threshold function value is applied, a third magnetic field is generated as the magnetic structure magnetic field. When the structure applied magnetic field less than the second threshold function value is applied, a fourth magnetic field is generated as the magnetic structure magnetic field which is weaker than the third magnetic field. A first write current supplied to one of the plurality of first signal lines as a first selected signal line, such that a first magnetic field is generated. A second write current is supplied to one of the plurality of second signal lines as a second selected signal line, such that a second magnetic field is generated. A first synthetic magnetic field of the first magnetic field and the second magnetic field is applied to the magnetic structure as the structure applied magnetic field. A second synthetic magnetic field of the first synthetic magnetic field and the magnetic structure magnetic field is generated as the element applied magnetic field such that the element applied magnetic field equal to or larger than the first threshold function value is applied to the selected memory cell provided at the intersection of the first selected signal line and the second selected signal line, and such that the element applied magnetic field less than the first threshold function value is applied to each of non-selected memory cells other than the selected memory cell.

Herein, each of the plurality of magnetic structures is composed of a first magnetic layer formed of ferromagnetic material, a second magnetic layer formed of ferromagnetic material and a non-magnetic layer interposed between the first magnetic layer and the second magnetic layer. The non-magnetic layer has a film thickness such that the first magnetic layer is anti-ferromagnetically coupled to the second magnetic layer. Especially, the second threshold function is preferably determined based on the film thickness of the non-magnetic layer. It is preferable that when the structure applied magnetic field is not applied, the intensity of the magnetic structure magnetic field generated by the magnetic structure is substantially 0 from the viewpoint of offset.

Also, the first synthetic magnetic field larger than the second threshold function value is applied as the structure applied magnetic field to the magnetic structure corresponding to the selected memory cell. The magnetic structure corresponding to the selected memory cell generates the third magnetic field as the magnetic structure magnetic field. The synthetic magnetic field of the first synthetic magnetic field and the third magnetic field is applied to the magneto-resistance element of the selected memory cell as the element applied magnetic field equal to or larger than the first threshold function value. The first synthetic magnetic field less than the second threshold function value is applied as the structure applied magnetic field to the magnetic structure corresponding to each of the non-selected memory cells. The magnetic structure corresponding to the non-selected memory cell generates the fourth magnetic field as the magnetic structure magnetic field. The synthetic magnetic field of the first synthetic magnetic field and the fourth magnetic field may be applied to the magneto-resistance element of the selected memory cell as the element applied magnetic field less than the first threshold function value.

Otherwise, the first synthetic magnetic field less than the second threshold function value may be applied as the structure applied magnetic field to the magnetic structure corresponding to the selected memory cell. The magnetic structure corresponding to the selected memory cell generates the fourth magnetic field as the magnetic structure magnetic field. The synthetic magnetic field of the first synthetic magnetic field and the fourth magnetic field is applied to the magneto-resistance element of the selected memory as the element applied magnetic field equal to or larger than the first threshold function value. The first synthetic magnetic field equal to or larger than the second threshold function value is applied as the structure applied magnetic field to the magnetic structure corresponding to each of the non-selected memory cells. The magnetic structure corresponding to the non-selected memory cell gener-ates the third magnetic field as the magnetic structure magnetic field. The synthetic magnetic field of the first synthetic magnetic field and the third magnetic field may be applied to the magneto-resistance element of the selected memory as the element applied magnetic field less than the first threshold function value.

It is preferable that the first signal line and the second signal line are provided between a corresponding one of the plurality of memory cells, and the magnetic structure corresponding to the corresponding memory cell, and the magnetic structure is provided directly or indirectly on the first signal line. Otherwise, each of the plurality of memory cells and the magnetic structure corresponding to the memory cell may be provided between the first signal line corresponding to the memory cell and the second signal line corresponding to the memory cell. Herein, the magnetic structure may have a circular plane structure, and the magnetic structure may have an elliptical plane structure. In this case, an elliptical long axis of the magnetic structure may be directed into the first direction or the second direction, and may be directed into a direction other than the first direction and the second direction. It is preferable that the elliptical long axis of the magnetic structure is directed to the direction of 45 degrees from each of the first direction and the second direction.

According to a second aspect of the present invention, the magnetic random access memory is composed of the plurality of first signal lines provided to extend in the first direction, a plurality of second signal lines provided to extend in the second direction substantially perpendicular to the first direction, a plurality of memory cells, each of which contains a magneto-resistance element having a spontaneous magnetization whose direction is reversed according to data to be stored and are respectively provided at the positions of the plurality of first signal lines and the plurality of second signal lines, and a plurality of magnetic structures which are provided for the plurality of memory cells, and each of which applies a magnetic field to the magneto-resistance element contained in a corresponding one of the memory cells based on induced magnetization. One of the plurality of memory cells provided for the intersection of a first one selected from the plurality of first signal lines and a second one selected from the plurality of second signal lines is a selected memory cell. One of the plurality of magnetic structures corresponding to the selected memory cell is a selected magnetic structure. Ones of the plurality of memory cells which are other than the selected memory cell and which the first selected signal line intersects are first non-selected memory cells. One of the plurality of magnetic structures corresponding to one of the first non-selected memory cells is a first non-selected magnetic structure. At this time, a synthetic magnetic field $H_{xy}$ applied to the selected magnetic structure by a first write current flowing through the first selected signal line in a write operation and a second write current flowing through the second selected signal line in the write operation, a magnetization $M_{xy}$ induced in the selected magnetic structure by the synthetic magnetic field $H_{xy}$, a magnetic field $H_y$ applied to the first non-selected magnetic structure by the first write current in the write operation, and a magnetization $M_y$ induced in the first non-selected magnetic structure by the magnetic field $H_y$ satisfy the following relation:

$$M_{xy}/H_{xy} \neq M_y/H_y.$$

Ones of the plurality of memory cells other than the selected memory cell which the second selected signal line intersects is second non-selected memory cells, and one of the plurality of magnetic structures corresponding to the second non-selected memory cell is a second non-selected magnetic structure. At this time, it is preferable that the synthetic magnetic field $H_{xy}$, the magnetization $M_{xy}$, the magnetic field $H_x$ applied to the second non-selected magnetic structure by the second write current in the write operation, and a magnetization $M_x$ induced in the second non-selected magnetic structure by the magnetic field $H_x$ satisfy the following relation:

$$M_{xy}/H_{xy} \neq M_x/H_x.$$

It is preferable that the plurality of magnetic structures are arranged in the positions where the magnetization $M_{xy}$ and the magnetization $M_y$ are induced such that the magnetic field applied to the magneto-resistance element contained in the selected memory cell by the first write current and the second write current and the magnetic field applied to the magneto-resistance element contained in the first non-selected memory cell by the first write current are enhanced. It is also preferable that the magnetic field $H_y$, the synthetic magnetic field $H_{xy}$, the magnetization $M_y$ and the magnetization $M_{xy}$ satisfy $M_{xy}/H_{xy} > M_y/H_y$.

Herein, the first signal line and the second signal line are located between the plurality of magnetic structures and the plurality of memory cells. The magnetic field $H_y$, the synthetic magnetic field $H_{xy}$, the magnetization $M_y$ and the magnetization $M_{xy}$ satisfy $M_{xy}/H_{xy} > M_y/H_y$. In this case, ones of the plurality of memory cells other than the selected memory cell which the second selected signal line intersects is second non-selected memory cells, and one of the plurality of magnetic structures corresponding to the second non-selected memory cell is a second non-selected magnetic structure. It is preferable that the synthetic magnetic field $H_{xy}$, the magnetization $M_{xy}$, the magnetic field $H_x$ applied to the second non-selected magnetic structure by the second write current in the write operation, and the magnetization $M_x$ induced in the second non-selected magnetic structure by the magnetic field $H_x$ satisfy $M_{xy}/H_{xy} > M_x/H_x$.

It is preferable that the plurality of magnetic structures are arranged in the positions where the magnetization $M_{xy}$ and the magnetization $M_y$ are induced such that the magnetic field applied to the magneto-resistance element contained in the selected memory cell by the first write current and the second write current and the magnetic field applied to the magneto-resistance element contained in the first non-selected memory cell by the first write current are weakened. It is also preferable that the magnetic field $H_y$, the synthetic magnetic field $H_{xy}$, the magnetization $M_y$, and the magnetization $M_{xy}$ satisfy $M_{xy}/H_{xy} < M_y/H_y$.

It is preferable that the plurality of magnetic structures and the plurality of memory cells are located between the first signal line and the second signal line, and the magnetic field $H_y$, the synthetic magnetic field $H_{xy}$, the magnetization $M_y$ and the magnetization $M_{xy}$ satisfy $M_{xy}/H_{xy} < M_y/H_y$.

Ones of the plurality of memory cells other than the selected memory cell which the second selected signal line intersects are second non-selected memory cells, and one of the plurality of magnetic structures corresponding to the second non-selected memory cell is a second non-selected magnetic structure. It is preferable that the synthetic magnetic field $H_{xy}$, the magnetization $M_{xy}$, the magnetic field $H_x$ applied to the second non-selected magnetic selected structure by the second write current in the write operation, and the magnetization $M_x$ induced in the second non-selected magnetic selected structure satisfy $M_{xy}/H_{xy} < M_x/H_x$. In this case, it is preferable that each of the plurality of magnetic structures is a ferri-magnetic laminate structure containing a first magnetic layer formed of ferromagnetic material, a second magnetic layer formed of ferromagnetic material, and a non-magnetic layer interposed between the first magnetic layer and the second magnetic layer and having a film thickness such that the first magnetic layer is anti-ferromagnetically coupled to the second magnetic layer.

Each of the plurality of magnetic structures is a ferri-magnetic laminate structure containing a first magnetic layer formed of ferromagnetic material, a second magnetic layer formed of ferromagnetic material, and a non-magnetic layer which is interposed between the first magnetic layer and the second magnetic layer, and has the film thickness such that the first magnetic layer is anti-ferromagnetically coupled to the second magnetic layer. It is preferable that the synthetic magnetic field $H_{xy}$ is larger than a threshold magnetic field $H_{txy}$ of the ferri-magnetic laminate structure in the direction of the synthetic magnetic field $H_{xy}$, and a magnetic field $H_y$ is smaller than a threshold magnetic field $H_{ty}$ of the ferri-magnetic laminate structure in the direction of a magnetic field $H_y$.

Each of the plurality of magnetic structures is a ferri-magnetic laminate structure containing a first magnetic layer formed of ferromagnetic material, a second magnetic layer formed of ferromagnetic material, and a non-magnetic layer which is interposed between the first magnetic layer and the second magnetic layer and has the film thickness such that the first magnetic layer is anti-ferromagnetically coupled to the second magnetic layer. It is preferable that a synthetic magnetic field $H_{xy}$ is larger than a threshold magnetic field $H_{txy}$ of the ferri-magnetic laminate structure in the direction of the synthetic magnetic field $H_{xy}$, a magnetic field $H_x$ is smaller than a threshold magnetic field $H_{tx}$ of the ferri-magnetic laminate structure in the direction of a magnetic field $H_x$ and a magnetic field $H_y$ is smaller than a threshold magnetic field $H_{ty}$ of the ferri-magnetic laminate structure in the direction of a magnetic field $H_y$.

Anisotropy may be given to the magneto-resistance element such that the direction of a spontaneous magnetization that the magneto-resistance element is substantially coincident with the first direction, and to the ferri-magnetic laminate structure such that the directions of spontaneous magnetizations of the first magnetic layer and the second magnetic layer are directed into a third direction which is not perpendicular to the first direction. In this case, it is preferable that the angle between the first direction and the third direction is substantially 45 degrees.

It is preferable that the direction of the synthetic magnetic field $H_{xy}$ is substantially perpendicular to the third direction.

Each of the plurality of magnetic structures is a ferri-magnetic laminate structure containing a first magnetic layer formed of ferromagnetic material, a second magnetic layer formed of ferromagnetic material, and a non-magnetic layer which is interposed between the first magnetic layer and the second magnetic layer and has a film thickness such that the first magnetic layer is anti-ferromagnetically coupled to the second magnetic layer. It is preferable that the synthetic magnetic field $H_{xy}$ is smaller than a threshold magnetic field $H_{txy}$ of the ferri-magnetic laminate structure in the direction of the synthetic magnetic field $H_{xy}$, and a magnetic field $H_y$ is larger than the threshold magnetic field $H_{ty}$ of the ferri-magnetic laminate structure in the direction of the magnetic field $H_y$.

Also, it is preferable that anisotropy is given to the magneto-resistance element such that the direction of a spontaneous magnetization of the magneto-resistance element is substantially coincident with the first direction, and to the ferri-magnetic laminate structure such that the directions of a spontaneous magnetizations of the first magnetic layer and the second magnetic layer are substantially coincident with the first direction.

Each of the plurality of magnetic structures is a ferri-magnetic laminate structure containing a first magnetic layer formed of ferromagnetic material, a second magnetic layer formed of ferromagnetic material, and a non-magnetic layer which is interposed between the first magnetic layer and the second magnetic layer and has the film thickness such that the first magnetic layer is anti-ferromagnetically coupled to the second magnetic layer. It is preferable that the synthetic magnetic field $H_{xy}$ is smaller than a threshold magnetic field $H_{fxy}$ of the ferri-magnetic laminate structure in the direction of the synthetic magnetic field $H_{xy}$. It is preferable that the magnetic field $H_x$ is larger than the threshold magnetic field $H_{fx}$ of the ferri-magnetic laminate structure in the direction of the magnetic field $H_x$ and the magnetic field $H_y$ is larger than the threshold magnetic field $H_{fy}$ of the ferri-magnetic laminate structure in the direction of the magnetic field $H_y$.

It is preferable that anisotropy is given to the magneto-resistance element such that the direction of a spontaneous magnetization of the magneto-resistance element is substantially coincident with the first direction, and to the ferri-magnetic laminate structure such that the directions of the spontaneous magnetizations of the first magnetic layer and the second magnetic layer are directed into the third direction which is not perpendicular to the first direction. In this case, it is preferable that the direction of the synthetic magnetic field $H_{xy}$ is substantially identical to the third direction.

BRIEF DESCRIPTION OF DRAWINGS

FIG. 4 is a circuit diagram showing the circuit configuration of the MRAM according to a first embodiment of the present invention;

FIG. 27A is a diagram showing a synthetic magnetic field $H_{2xy}$ applied to the ferri-magnetic laminate structure corresponding to the selected memory cell in the fourth embodiment;

FIG. 27B is a diagram showing the synthetic magnetic field $H_{2x}$ applied to the ferri-magnetic laminate structure corresponding to the memory cell connected to the non-selected word line and the selected bit line;

FIG. 27C is a diagram showing the synthetic magnetic field $H_{2y}$ applied to the ferri-magnetic laminate structure corresponding to the memory cell connected to the selected word line and the non-selected bit line.

BEST MODE FOR CARRYING OUT THE INVENTION

Figure 1:
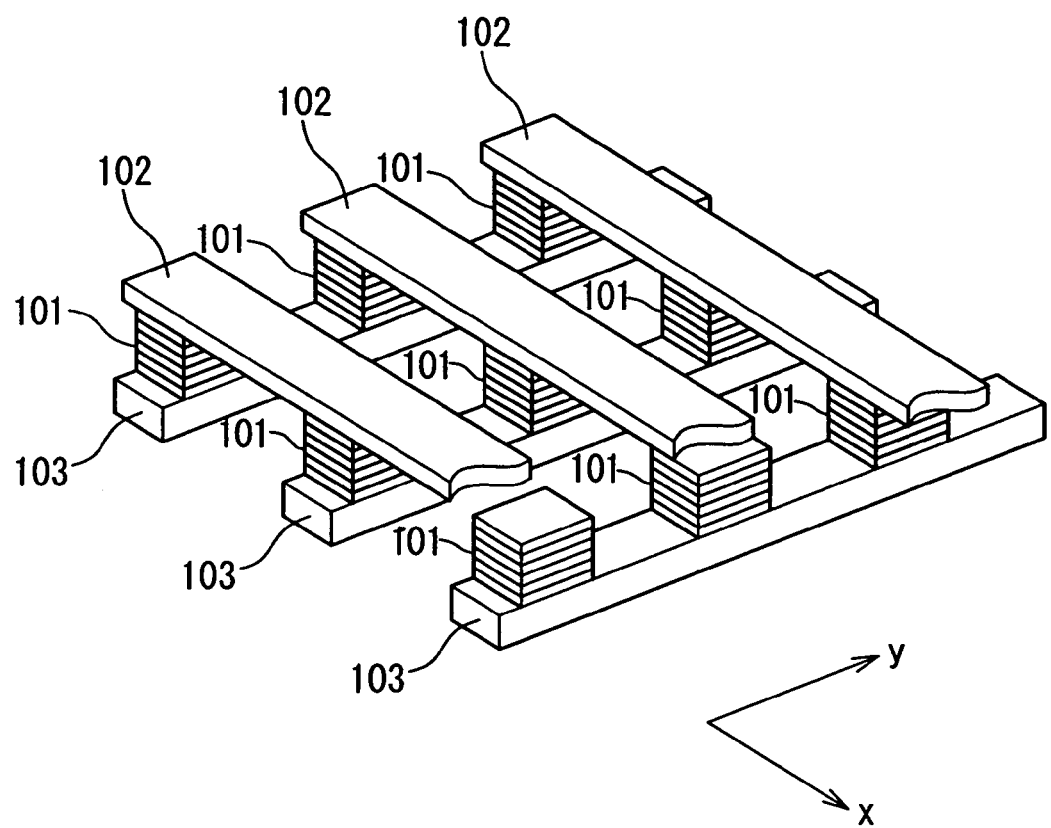
FIG. 1 is a diagram showing a conventional magnetic random access memory (MRAM)
Figure 2A:
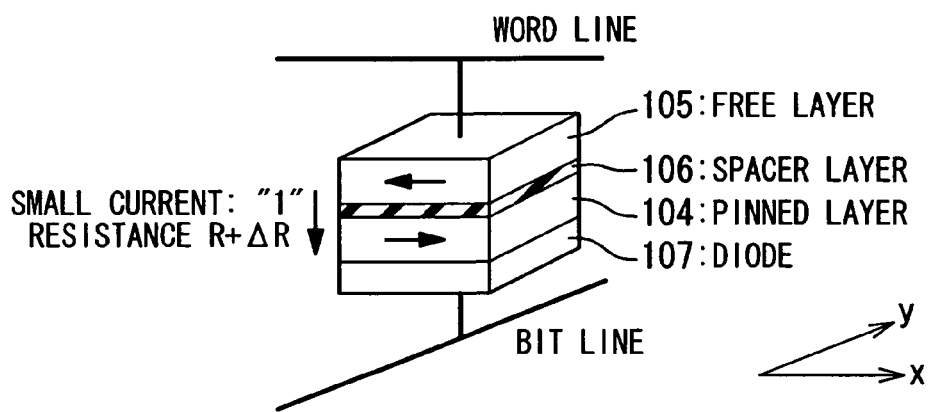
FIGS. 2A and 2B are sectional views showing the structure of a memory cell used in the conventional MRAM.
Figure 2B:
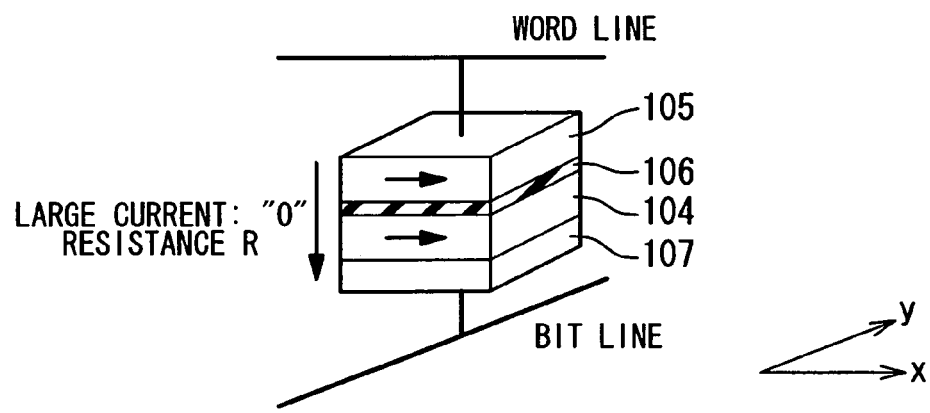
Figure 3A:
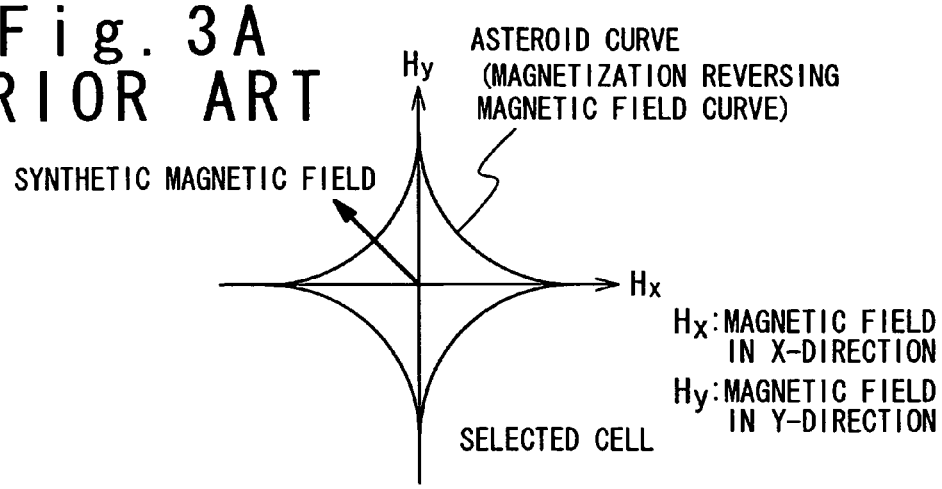
FIGS. 3A to 3C are diagrams showing write principles to the memory cell of the conventional MRAM.
Figure 3B:
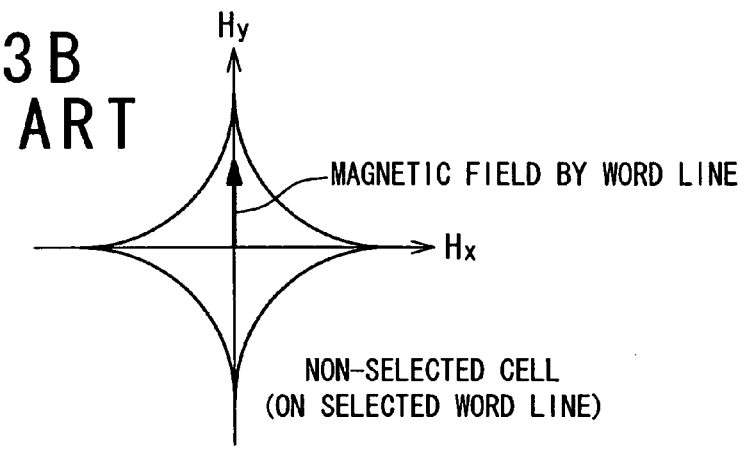
Figure 3C:
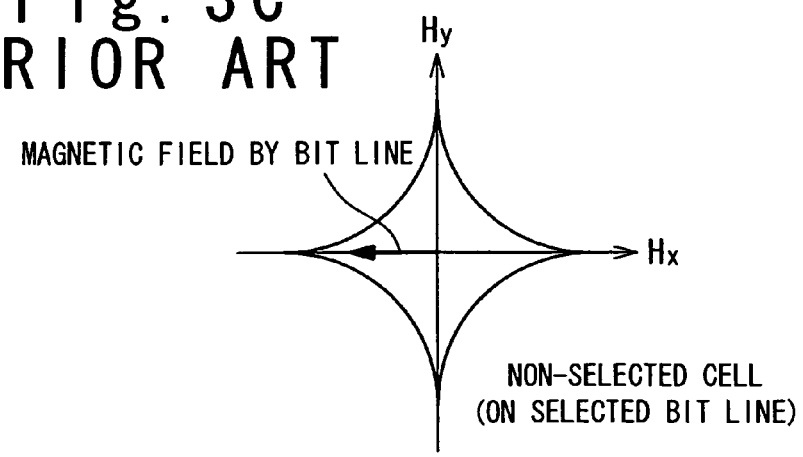

Hereinafter, a magnetic random access memory (MRAM) according to the present invention will be described with reference to the attached drawings.

[First Embodiment]

As shown in FIG. 4, the MRAM according to the first embodiment of the present invention is provided with a memory cell array 1 in which memory cells 2 are arranged in a matrix. Write word lines 3 extending in the X-axis direction, read word lines 4 provided in parallel with the write word line 3 and bit lines 5 extending in the Y-axis direction are arranged in the memory cell array 1. The X-axis direction is substantially perpendicular to the Y-axis direction. Herein, it should be noted that the term "X axis direction" contains both a positive direction of the X-axis (+X direction) and a negative direction of X-axis (−X direction), and the term "Y axis direction" contains both a positive direction of the Y-axis (+Y direction) and a negative direction of the Y-axis (−Y direction). The memory cells 2 are respectively provided at the intersections of the write word lines 3 and the bit lines 5.

The memory cell 2 contains a MOS transistor 6 and a magneto-resistance element (spin valve) 7. The MOS transistor 6 is interposed between the magneto-resistance element 7 and a ground terminal 14. The MOS transistor 6 is used to connect the magneto-resistance element 7 to the ground terminal 14 in a read operation. The magneto-resistance element 7 has reversible spontaneous magnetization, and the magneto-resistance element 7 holds and stores data according to the direction of the spontaneous magnetization. The magneto-resistance element 7 is interposed between the MOS transistor 6 and the bit line 5. The detail of the structure of the magneto-resistance element 7 will be described below.

The write word lines 3 are connected to a write X selector 8. The write X selector 8 selects one of the write word lines 3 as a selected write word line in the write operation. The write X selector 8 is connected to an X side current source circuit 9. The X side current source circuit 9 generates a write current $I_x$, and supplies the generated write current $I_x$ to the selected write word line through the write X selector 8.

The read word lines 4 are connected to a read X selector 10. The read X selector 10 selects one of the read word lines 4 as a selected read word line in the read operation, and sets the selected read word line to "High" voltage. The MOS transistors 6 connected to the selected read word line are activated, and the activated MOS transistor 6 connects the magneto-resistance element 7 to the ground terminal 14. When a voltage is applied to the bit line 5 in the state that the magneto-resistance element 7 is electrically connected to the ground terminal 14, a detected current flows through the magneto-resistance element 7. The resistance of the magneto-resistance element 7 is detected from the detected current, and the data of the memory cell 2 is distinguished from the detected resistance.

The bit lines 5 are connected to a Y selector 11. The Y selector 11 selects one of the plurality of bit lines 5 as a selected bit line in the write operation and in the read operation. The Y selector 11 is connected to a Y side current source circuit 12 and a sense amplifier 13. The Y side current source circuit 12 generates a write current $I_y$, and supplies the generated write current $I_y$ to the selected bit line. The sense amplifier 13 is connected to the selected bit line in the read operation, and distinguishes the data stored in the memory cell 2 from the current flowing through the magneto-resistance element 7.

Figure 5:
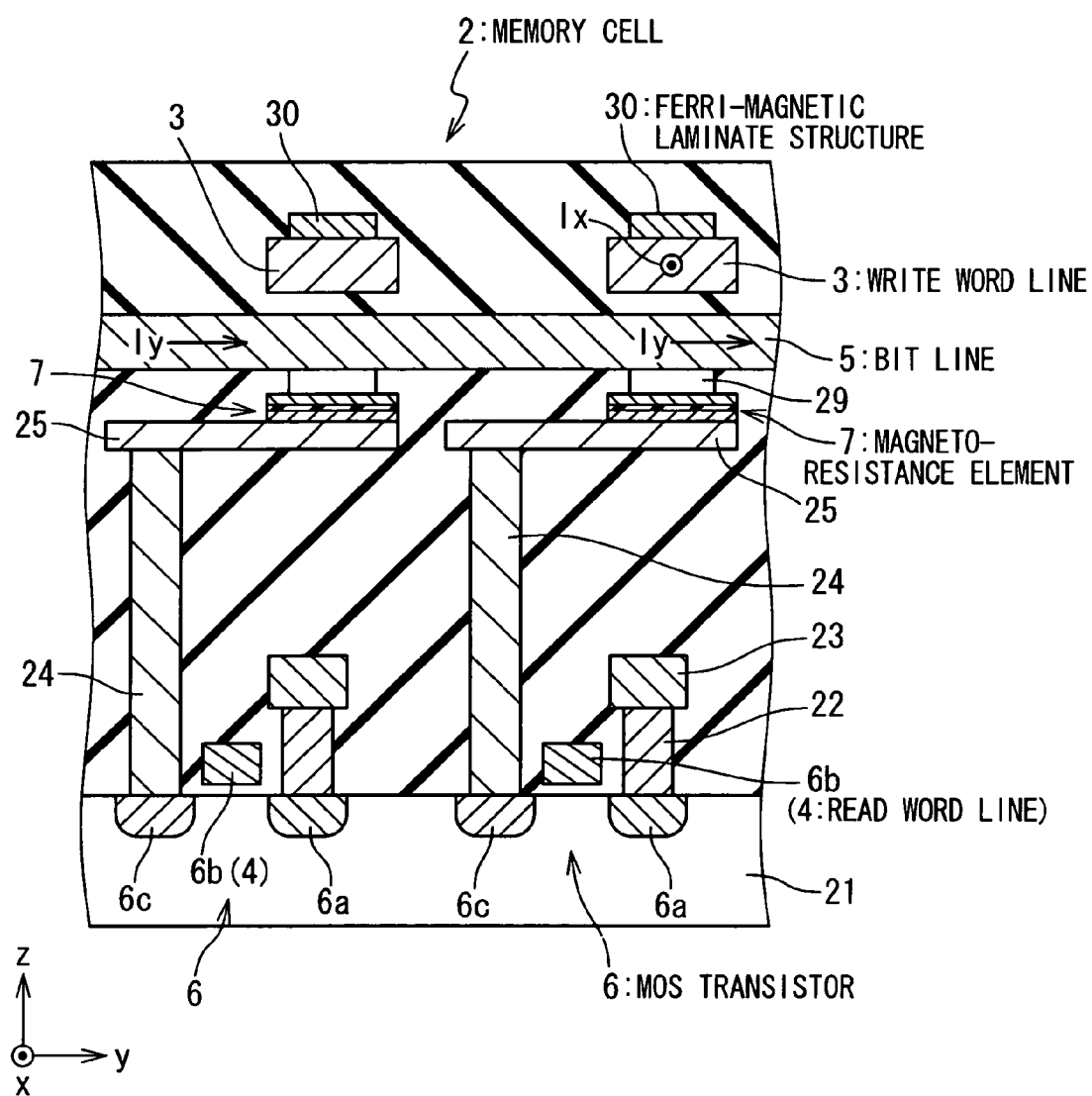
FIG. 5 is a sectional view of a memory cell of the MRAM according to the first embodiment.

FIG. 5 is a sectional view showing the structure of the memory cell 2. The MOS transistor 6 is formed in the surface portion of a semiconductor substrate 21 with reference to FIG. 5. A source 6a of the MOS transistor 6 is connected to a grounding wire 23 having a ground potential through a contact 22. The grounding wire 23 is used as a ground terminal 14. A gate 6b of the MOS transistor 6 is used as a read word line 4. A drain 6c of the MOS transistor 6 is connected to a lead-out wiring layer 25 extending in the Y-axis direction through a contact 24. The magneto-resistance element 7 is formed on the lead-out wiring layer 25.

Figure 6:
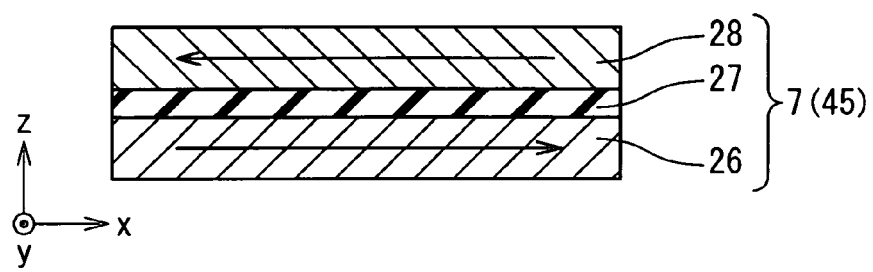
FIG. 6 shows a structure of the magneto-resistance element provided in the memory cell.

FIG. 6 is an enlarged sectional view showing the structure of the magneto-resistance element 7 in detail. With reference to FIG. 6, the magneto-resistance element 7 contains a pinned layer 26, an insulating barrier layer 27 and a free layer 28. The pinned layer 26 is formed on the lead-out wiring layer 25, the insulating barrier layer 27 is formed on the pinned layer 26, and the free layer 28 is formed on the insulating barrier layer 27. Both the pinned layer 26 and the free layer 28 are formed of ferromagnetic material, and have spontaneous magnetizations. The direction of the spontaneous magnetization of the pinned layer 26 is fixed in the +X axis direction. The direction of the spontaneous magnetization of the free layer 28 can be reversed, and can be directed to the two directions of the +X axis direction and the −X axis direction. The data stored in the memory cell 2 is stored as the direction of the spontaneous magnetization of the free layer 28. The insulating barrier layer 27 is interposed between the pinned layer 26 and the free layer 28 is formed of insulator. The film thickness of the insulating barrier layer 27 is thin to an extent that a tunnel current can flow in the direction of the film thickness (z axis direction).

Figure 9:
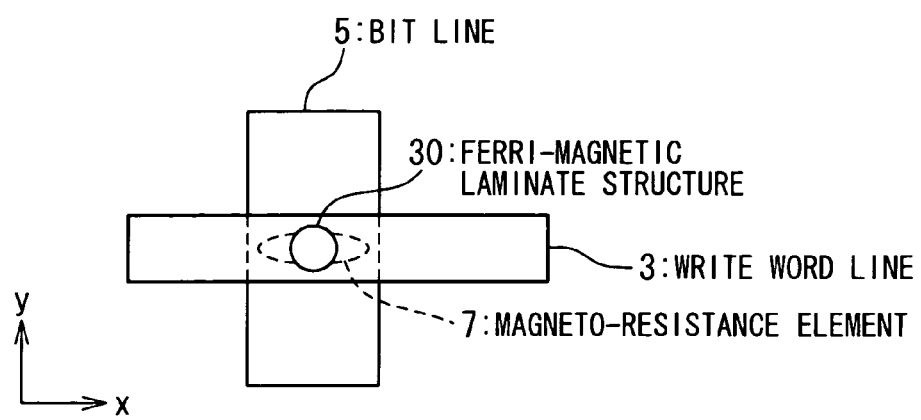
FIG. 9 is a plan view showing the structure of a magneto-resistance element and the ferri-magnetic laminate structure.

FIG. 9 is a plan view of the memory cell 2. As shown in FIG. 9, the magneto-resistance element 7 has a substantial elliptical shape. The long axis of the magneto-resistance element 7 is parallel to the X-axis direction. The structure give anisotropy to the magneto-resistance element 7 such that the directions of the spontaneous magnetizations of the pinned layer 26 and free layer 27 is directed to the X-axis direction.

With reference to FIG. 5 again, the magneto-resistance element 7 is connected to the bit line 5 through a contact 29. As described above, the bit line 5 is provided to extend in the Y-axis direction. The write word line 3 is formed above the bit line 5. The bit line 5 and the write word line 3 are separated by an interlayer insulating film. As described above, the write word line 3 is provided to extend in the X-axis direction.

A ferri-magnetic laminate structure 30 is locally formed on the write word line 3. The ferri-magnetic laminate structure 30 is provided for every memory cell 2. As described below, each ferri-magnetic laminate structure 30 functions to enhance the magnetic field applied to the magneto-resistance element 7 contained in the memory cell 2 corresponding to the ferri-magnetic laminate structure 30.

Figures 7A, 7B, 7C:
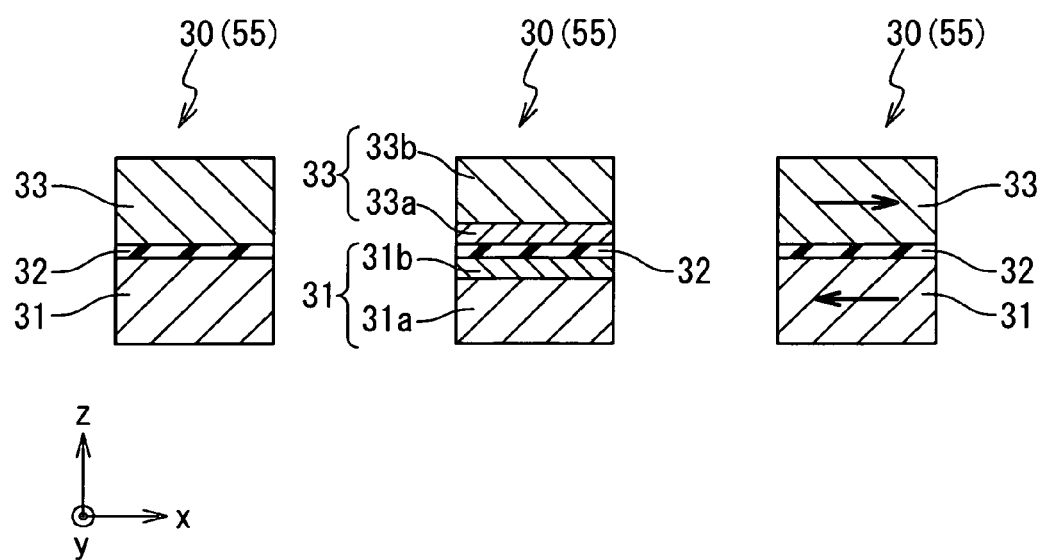
FIGS. 7A to 7C are diagrams showing the structures of a ferri-magnetic laminate structure.

FIGS. 7A to 7C show sectional structures of the ferri-magnetic laminate structure 30. As shown in FIG. 7A, the ferri-magnetic laminate structure 30 contains a first magnetic layer 31, a non-magnetic spacer layer 32 and a second magnetic layer 33. Both the first magnetic layer 31 and the second magnetic layer 33 are formed of ferromagnetic material, and the non-magnetic spacer layer 32 interposed between the first magnetic layer 31 and the second magnetic layer 33 is formed of non-magnetic material. As shown in FIG. 9, the ferri-magnetic laminate structure 30 has a substantially circular shape on a plane, and has an isotropic shape. The structure makes the magnetic field-magnetization characteristic of the ferri-magnetic laminate structure 30 isotropic on a X-Y plane.

With reference to FIG. 7A, the film thickness t of the non-magnetic spacer layer 32 of the ferri-magnetic spacer layer 32 of the ferri-magnetic laminate structure 30 is determined such that the first magnetic layer 31 is anti-ferromagnetically coupled to the second magnetic layer 33. Therefore, in the state that the magnetic field is not applied the ferri-magnetic laminate structure 30, the first magnetic layer and the second magnetic layer 33 have spontaneous polarizations whose directions are opposite to each other, as shown in FIG. 7C. Also, the first magnetic layer 31 is anti-ferromagnetically coupled to the second magnetic layer 33. In this state, the total magnitude of magnetization of the ferri-magnetic laminate structure 30 is substantially 0. That is, in the state that the magnetic field is not applied to the ferri-magnetic laminate structure 30, the ferri-magnetic laminate structure 30 does not have a magnetic moment substantially. It is preferable that the ferri-magnetic laminate structure 30 does not have the magnetic moment as a whole, a magnetic field generated by the magnetic moment is applied to the magneto-resistance element 7. Therefore, in the state that the currents $I_x$ and $I_y$ are not supplied to the selected write word line and the selected bit line, the magnetic field generated by the magnetic moment is applied to the magneto-resistance element 7. This magnetic field makes a reversing magnetic field (coercive force) where the spontaneous magnetization of the free layer 28 of the magneto-resistance element 7 is reversed asymmetrical, so that the magneto-resistance element 7 has the offset magnetic field. It is not preferable since an existence of the offset magnetic field. It is not preferable since an existence of the offset magnetic field applied to the magneto-resistance element 7 increases the write currents $I_x$ and $I_y$, and an operation margin of the memory cell 2 is decreased. The ferri-magnetic laminate structure 30 which does not have the magnetic moment effectively prevents the generation of the offset magnetic field in the magneto-resistance element 7.

Figure 8:
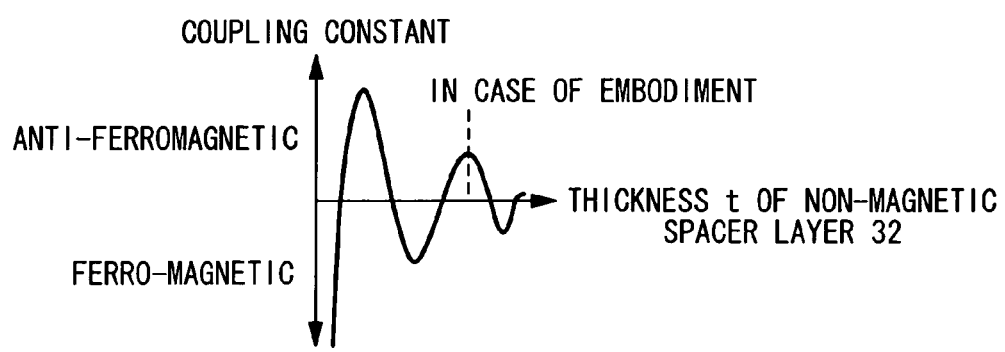
FIG. 8 is a diagram showing a coupling coefficient between a first magnetic layer and a second magnetic layer of the ferri-magnetic laminate structure.

FIG. 8 is graph showing a coupling coefficient between the first magnetic layer 31 and the second magnetic layer 33. With reference to FIG. 8, the coupling coefficient is defined to be positive when the first magnetic layer 31 is anti-ferromagnetically coupled to the second magnetic layer 33. When the film thickness t of the non-magnetic spacer layer 32 is extremely close to 0, the coupling coefficient between the first magnetic layer 31 and the second magnetic layer 33 is negative, and exists in a ferromagnetic region in which the first magnetic layer 31 is ferromagnetically coupled to the second magnetic layer 33. When the film thickness t increases from 0, and reaches a certain film thickness, the coupling coefficient is positive, and at this time the first magnetic layer 31 is anti-ferromagnetically coupled to the second magnetic layer 33. Also, the coupling coefficient shows a maximum value at a certain film thickness. When the film thickness increases further, the coupling coefficient vibrates while attenuating. The film thickness t of the non-magnetic spacer layer 32 is defined in such a way that the coupling coefficient between the first magnetic layer 31 and the second magnetic layer 33 is positive. It is preferable that the film thickness t of the non-magnetic spacer layer 32 is set to be substantially maximum such that the anti-ferromagnetical coupling between the first magnetic layer 31 and the second magnetic layer 33 is stable for the deviation of the film thickness t of the non-magnetic spacer layer 32.

FIG. 7B shows a sectional structure of the suitable ferri-magnetic laminate structure 30. In the suitable ferri-magnetic laminate structure 30, the first magnetic layer 31 contains a NiFe layer 31a and a CoFe layer 31b, and the second magnetic layer 33 contains a CoFe layer 33a and a NiFe layer 33b. The non-magnetic spacer layer 32 is formed of a Ru layer. The CoFe layer 31b is formed on the NiFe layer 31a, and the Ru layer 32 is formed on the CoFe layer 31b. The CoFe layer 33a is formed on the Ru layer 32, and the NiFe layer 33b is formed on the CoFe layer 33a.

This structure of the ferri-magnetic laminate structure 30 has an advantage that the design of the ferri-magnetic laminate structure 30 is easy since the characteristic of the ferri-magnetic laminate structure 30 is easily adjusted. The magnetization of the ferri-magnetic laminate structure 30 can be independently determined by the thickness of the NiFe layer 31a and NiFe layer 33b. Further, the coupling coefficient between the first magnetic layer 31 and the second magnetic layer 33 can be independently determined by the thickness of the Ru layer 32. Thus, the characteristic of the ferri-magnetic laminate structure 30 can be freely determined by the thicknesses of the NiFe layer 31a, the NiFe layer 33b and the Ru layer 32.

Figure 10A:
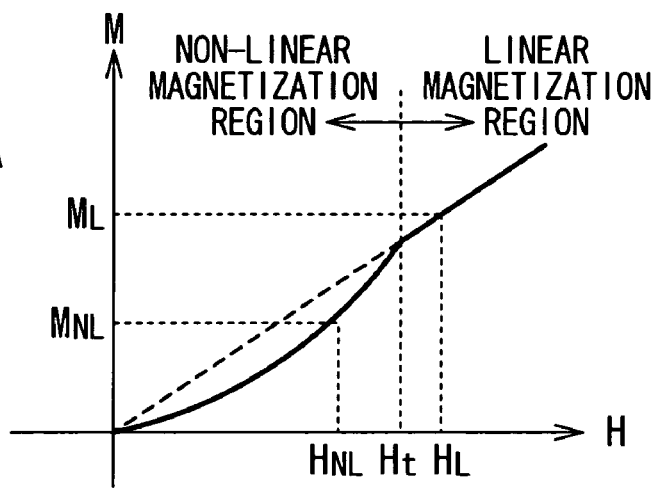
FIGS. 10A and 10B are diagrams showing the characteristic of ferri-magnetic laminate structure.
Figure 10B:
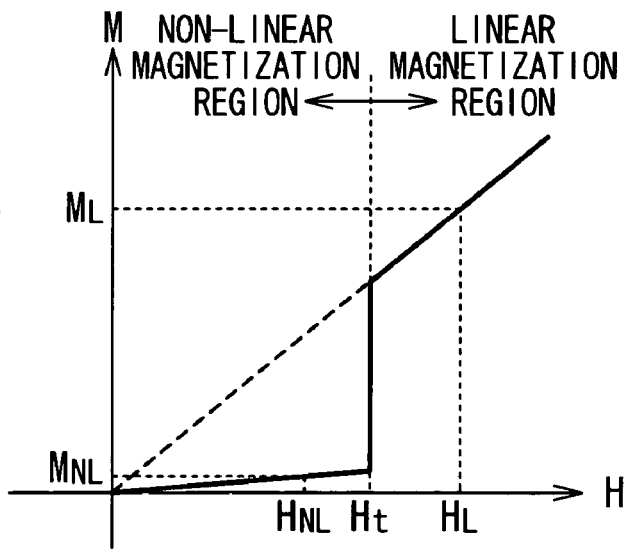

FIGS. 10A and 10B show magnetic field-magnetization characteristics of the ferri-magnetic laminate structure 30 having this structure. FIG. 10B shows an ideal magnetic field-magnetization characteristic of the ferri-magnetic laminate structure 30. The behavior of the magnetic field-magnetization characteristic of the ferri-magnetic laminate structure 30 in a region where an external magnetic field is larger than a threshold magnetic field $H_t$ is different from that in a small region where the external magnetic field is smaller than the threshold magnetic field $H_t$. The threshold magnetic field differs depending on the direction of the magnetic field, and functions as a threshold function. The threshold magnetic field $H_t$ is a magnetic field in which the anti-ferromagnetical coupling between the first magnetic layer 31 and the second magnetic layer 33 collapses substantially and completely. Ideally, the whole magnetization M of the ferri-magnetic laminate structure 30 is extremely small when the external magnetic field H is less than the threshold magnetic field $H_t$. The magnetization M increases discretely in the threshold magnetic field $H_t$, and the magnetization M increases linearly to the external magnetic field H in a region where the external magnetic field H exceeds the threshold magnetic field $H_t$. The reason why the ferri-magnetic laminate structure 30 shows the magnetic field-magnetization characteristic is because the magnetization M is small through the anti-ferromagnetical coupling between the first magnetic layer 31 and the second magnetic layer 33 when the external magnetic field H is less than the threshold magnetic field $H_t$, while the anti-ferromagnetical coupling between the first magnetic layer 31 and the second magnetic layer 33 changes to the ferromagnetic coupling and the magnetization M approximately proportional to the external magnetic field is generated by the ferri-magnetic laminate structure 30 when the external magnetic field H exceeds the threshold magnetic field $H_t$.

However, actually, the ferri-magnetic laminate structure 30 often shows the characteristic shown in FIG. 10A. That is, the ferri-magnetic laminate structure 30 shows the downward projecting magnetic field-magnetization characteristic in which the magnetization M increases non-linearly to the magnetic field H in the region where the external magnetic field H is less than the threshold magnetic field $H_t$. The ferri-magnetic laminate structure 30 shows the magnetic field-magnetization characteristic in which the magnetization M of the ferri-magnetic laminate structure 30 increases linearly to the magnetic field H in the region where the external magnetic field H exceeds the threshold magnetic field $H_t$. Especially, since the ferri-magnetic laminate structure 30 having such an isotropic shape as shown in FIG. 9 has a small magnetic domain inside thereof, the ferri-magnetic laminate structure 30 has a strong tendency to show the non-linear characteristic shown in FIG. 10A in the region where the external magnetic field H is less than the threshold magnetic field $H_t$ by the magnetization of the magnetic domain.

The behavior of the magnetic field-magnetization characteristic of the ferri-magnetic laminate structure 30 changes in the threshold magnetic field $H_t$ taken as the border in any case of FIGS. 10A and 10B. As described below, the magnetic field-magnetization characteristic of the ferri-magnetic laminate structure 30 plays an important role in the improvement in the selectivity of the memory cell 2. The threshold magnetic field $H_t$ can be adjusted by adjusting the coupling coefficient between the first magnetic layer 31 and the second magnetic layer 33. Hereinafter, a region where the magnetic field is less than the threshold magnetic field $H_t$ is called a non-linear magnetization region, and a region where the magnitude of the magnetic field is equal to or larger than the threshold magnetic field $H_t$ is called a linear magnetization region. When an arbitrary magnetic field $H_{NL}$ of the non-linear magnetization region and an arbitrary magnetic field HL of the linear magnetization region are respectively applied to the ferri-magnetic laminate structure 30, the magnetization $M_{NL}$ and magnetization ML induced in the ferri-magnetic laminate structure 30 satisfy the following equation:

$$M_L/H_L > M_{NL}/H_{NL} \quad (1)$$

The equation (1) means that the effectual magnetic susceptibility $\chi L$ (=ML/HL) in the linear magnetization region is larger than the effectual magnetic susceptibility $\chi_{NL}$ (=$M_{NL}/H_{NL}$) in the non-linear magnetization region.

In the MRAM of the first embodiment, the magnetic field applied to the magneto-resistance element 7 of the selected memory cell for data to be written is selectively and greatly increased by the operation of the ferri-magnetic laminate structure 30 having the above characteristic, and thereby, the selectivity of the selected memory cell is improved. Hereinafter, the detail will be described.

With reference to FIG. 4, the write operation of the MRAM of the first embodiment is started through the selection of the selected memory cell. One of the write word lines 3 is selected as the selected write word line by the write X selector 8, and one of the bit lines 5 is selected as the selected bit line by the Y selector 11. One of the memory cells 2 associated with the intersection of the selected write word line and the selected bit line is selected as the selected memory cell. Hereinafter, one of the memory cells 2 which concerns the selected bit line and does not concern the selected write word line is referred to as a memory cell connected to the non-selected word line and the selected bit line. One of the memory cells 2 which concerns the selected write word line and does not concern the selected bit line is mentioned as the memory cell connected to the selected word line and the non-selected bit line. After selecting the selected write word line and the selected bit line, the write current $I_x$ is flowed through the selected write word line in the +X axis direction by the X side current source circuit 9 and the write current $I_y$ is flowed through the selected bit line in the +Y axis direction or in the -Y axis direction by the Y side current source circuit 12. The direction of the write current $I_y$ is determined according to the data to be written in the selected memory cell.

With reference to FIG. 5, the magnetic field $H_{1y}$ is applied to the magneto-resistance element 7 of the memory cell connected to the selected word line and the non-selected bit line in the +Y axis direction by the write current $I_x$ flowing in the +X axis direction. Further, the magnetic field $H_{1x}$ is applied to the magneto-resistance element 7 of the memory cell connected to the non-selected word line and the selected bit line in the -X axis direction (or the +X direction) by the write current $I_y$ flowing in the +Y axis direction (or the -Y axis direction). Still further, a synthetic magnetic field $H_{1xy}$ of the magnetic field $H_{1x}$ and the magnetic field $H_{1y}$ is applied to the magneto-resistance element 7 of the selected memory cell.

When the write word line 3 and the bit line 5 are located between the ferri-magnetic laminate structure 30 and the magneto-resistance element 7, the above ferri-magnetic laminate structure 30 functions to enhance the magnetic field applied to the magneto-resistance element 7 of the memory cell connected to the selected word line and the non-selected bit line, the memory cell connected to the non-selected word line and the selected bit line and the selected memory cell when the write current $I_x$ and the write current $I_y$ flow.

Figure 12:
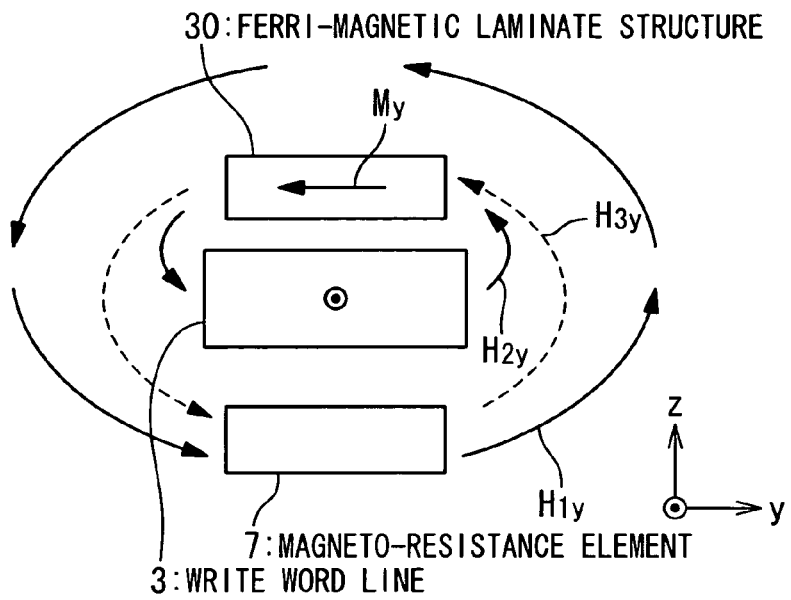
FIG. 12 is a diagram showing magnetic fields $H_{1y}$, $H_{2y}$, and $H_{3y}$ applied to the magneto-resistance element.

With reference to FIG. 12, the memory cell connected to the selected word line and the non-selected bit line will be described. As shown in FIG. 12, the magnetic field $H_{1y}$ in the +Y axis direction is applied to the magneto-resistance element 7 of the memory cell connected to the selected word line and the non-selected bit line by the write current $I_x$ flowing through the selected write word line in the +X axis direction. Further, the magnetic field $H_{2y}$ in the −Y axis direction is applied to the ferri-magnetic laminate structure 30 corresponding to the memory cell connected to the selected word line and the non-selected bit line by the write current $I_x$. Thus, a magnetization $M_y$ is induced in the −Y axis direction in the ferri-magnetic laminate structure 30 by applying the magnetic field $H_{2y}$. The magnetization $M_y$ induced in the ferri-magnetic laminate structure 30 applies the magnetic field $H_{3y}$ to the magneto-resistance element 7 of the memory cell connected to the selected word line and the non-selected bit line. When the selected write word line is located between the magneto-resistance element 7 and the ferri-magnetic laminate structure 30, the direction of the magnetic field $H_{3y}$ is the +Y axis direction as well as that of the magnetic field $H_{1y}$. Therefore, the ferri-magnetic laminate structure 30 functions to enhance the magnetic field applied to the magneto-resistance element 7 of the memory cell connected to the selected word line and the non-selected bit line when the write current $I_x$ is flowed through the selected write word line. Similarly, it could be understood that the ferri-magnetic laminate structure 30 corresponding to each of the memory cells connected to the non-selected word line and the selected bit line and the selected memory cell functions to enhance the magnetic field applied to the memory cell connected to the non-selected word line and the selected bit line and the magneto-resistance element 7 of the selected memory cell.

In this way, although the ferri-magnetic laminate structure 30 functions to enhance the magnetic field applied to the magneto-resistance element 7, the magnetic field applied to the magneto-resistance element 7 contained in the selected memory cell is selectively and notably enhanced by using the magnetic field-magnetization characteristic of the ferri-magnetic laminate structure 30 described above in the MRAM according to the first embodiment. This operation or function improves the selectivity of the selected memory cell effectively. Hereinafter, the improvement in the selectivity of the selected memory cell using the magnetic field-magnetization characteristic of the ferri-magnetic laminate structure 30 will be described in detail.

Figure 11A:
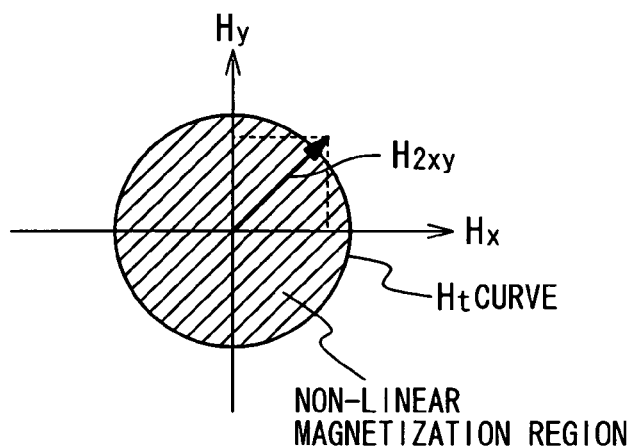
FIG. 11A is a diagram showing a synthetic magnetic field $H_{2xy}$ applied to the ferri-magnetic laminate structure corresponding to a selected memory cell.
Figure 11B:
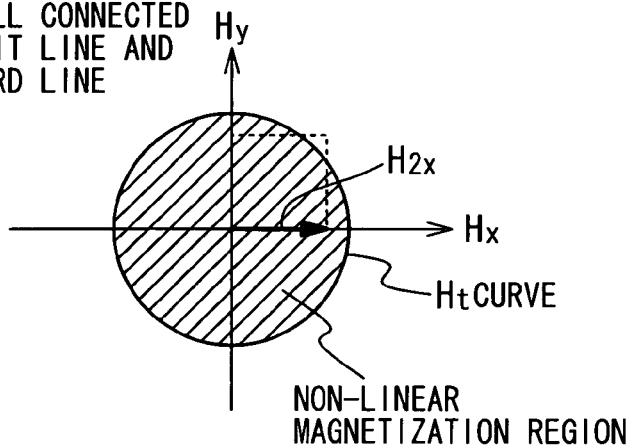
FIG. 11B is a diagram showing a magnetic field $H_{2x}$ applied to the ferri-magnetic laminate structure corresponding to a memory cell connected to a selected bit line and a non-selected word line.
Figure 11C:
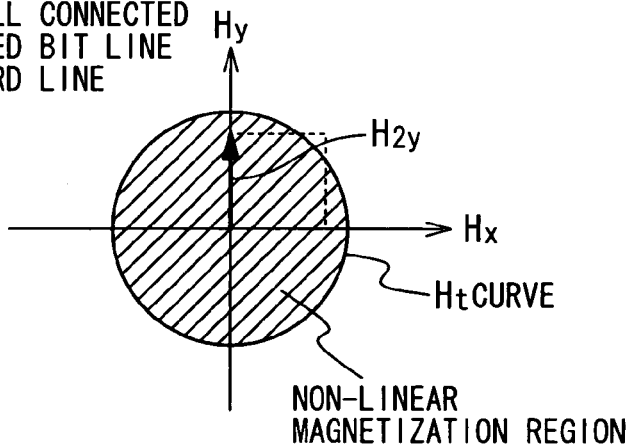
FIG. 11C is a diagram showing a magnetic field $H_{2y}$ applied to the ferri-magnetic laminate structure corresponding to a memory cell connected to a selected word line and a non-selected bit line.

In the following description, as shown in FIG. 11A, it is supposed that the magnetic field applied to the ferri-magnetic laminate structure 30 corresponding to the selected memory cell by the write currents $I_x$ and $I_y$ flowing through the selected write word line and the selected bit line respectively is $H_{2xy}$. Further, as shown in FIG. 11B, it is supposed that the magnetic field applied to the ferri-magnetic laminate structure 30 corresponding to the memory cell connected to the non-selected word line and the selected bit line by the write current $I_y$ flowing through the selected bit line is $H_{2x}$. Still further, as shown in FIG. 11C, it is supposed that the magnetic field applied to the ferri-magnetic laminate structure 30 corresponding to the memory cell connected to the selected word line and the non-selected bit line by the write current $I_x$ flowing through the selected write word line is $H_{2y}$. The magnetic field $H_{2xy}$ is the synthetic magnetic field of the magnetic field $H_{2x}$ and magnetic field $H_{2y}$.

With reference to FIGS. 11A to 11C, the improvement in the selectivity of the selected memory cell is attained by selecting the write currents $I_x$ and $I_y$ and the threshold magnetic field $H_t$ in such a way that following conditions are satisfied:

$$H_{2xy} > H_t,$$

$$H_{2x} < H_t,$$

$$H_{2y} < H_t \qquad (2)$$

That is, the write currents $I_x$ and $I_y$ are selected in such a way that the synthetic magnetic field $H_{2xy}$ applied to the ferri-magnetic laminate structure 30 corresponding to the selected memory cell exists in the linear magnetization region, and the magnetic field $H_{2x}$ and the magnetic field $H_{2y}$ applied to the ferri-magnetic laminate structure 30 corresponding to the memory cell connected to the non-selected word line and the selected bit line and the memory cell connected to the selected word line and the non-selected bit line respectively exist in the non-linear region. A synthetic magnetic field of the magnetic field $H_{2x}$, the magnetic field $H_{2y}$, and the magnetic field to the selected memory by the ferri-magnetic laminate structure 30 may be selected in the non-linear region.

Since the magnetic field $H_{2xy}$ is in the linear magnetization region and the magnetic field $H_{2x}$ and the magnetic field $H_{2y}$ are in the non-linear region, the following equation (3) is satisfied from the equation (1):

$$M_{xy}/H_{2xy} > M_x/H_{2x}$$

$$M_{xy}/H_{2xy} > M_y/H_{2y} \qquad (3)$$

Herein, $M_{xy}$ is the magnetization induced in the ferri-magnetic laminate structure 30 corresponding to the selected memory cell when the magnetic field $H_{2xy}$ is applied, $M_x$ is the magnetization induced in the ferri-magnetic laminate structure 30 corresponding to the memory cell connected to the non-selected word line and the selected bit line when the magnetic field $H_{2x}$ is applied, and $M_y$ is the magnetization induced in the ferri-magnetic laminate structure 30 corresponding to the memory cell connected to the selected word line and the non-selected bit line when the magnetic field $H_{2y}$ is applied.

The equation (3) means that the effectual magnetic susceptibility $\chi_{xy} (=M_{xy}/H_{2xy})$ of the ferri-magnetic laminate structure 30 corresponding to the selected memory cell is different from the effectual magnetic susceptibility $\chi_x (=M_x/H_{2x})$, $\chi_y (=M_y/H_{2y})$ of the ferri-magnetic laminate structure 30 corresponding to each of the memory cell connected to the non-selected word line and the selected bit line and the memory cell connected to the selected word line and the non-selected bit line, and is larger than the effectual magnetic susceptibility $\chi_x$ and $\chi_y$.

Since the magnetic field applied to the magneto-resistance element 7 by the ferri-magnetic laminate structure 30 is proportional to the magnetization induced in the ferri-magnetic laminate structure 30, the following equation (4) is derived from the equation (3).

$$H_{3xy}/H_{2xy} > H_{3x}/H_{2x}$$

$$H_{3xy}/H_{2xy} > H_{3y}/H_{2y} \qquad (4)$$

That is, $$H_{3xy}/H_{3x} > H_{2xy}/H_{2x}$$

$$H_{3xy}/H_{3y} > H_{2xy}/H_{2y} \qquad (4)'$$

Herein, $H_{3xy}$ is the magnetic field applied to the magneto-resistance element 7 of the selected memory cell by the ferri-magnetic laminate structure 30 corresponding to the selected memory cell, $H_{3x}$ is the magnetic field applied to the magneto-resistance element 7 of the memory cell connected to the non-selected word line and the selected bit line by the ferri-magnetic laminate structure 30 corresponding to the memory cell connected to the non-selected word line and the selected bit, line, and $H_{3y}$ is the magnetic field applied to the magneto-resistance element 7 of the memory cell connected to the selected word line and the non-selected bit line by the ferri-magnetic laminate structure 30 corresponding to the memory cell connected to the selected word line and the non-selected bit line.

The equation (4)' means that the magnetic field applied to the magneto-resistance element 7 contained in the selected memory cell is remarkably enhanced, compared with the magneto-resistance element 7 contained in the memory cell connected to the selected word line and the non-selected bit line and the memory cell connected to the non-selected word line and the selected bit line. For example, a case where the strength of the magnetic field $H_{2x}$ is equal to that of the magnetic field $H_{2y}$, so that the magnetic field $H_{3x}$ is equal to the magnetic field $H_{3y}$ will be considered. The strength of the magnetic field $H_{2xy}$, which is the synthetic magnetic field of the magnetic field $H_{2x}$ and magnetic field $H_{2y}$ is $2^{1/2}$ times that of the magnetic field $H_{2x}$ ($H_{2y}$). On the other hand, the following equation (5) is obtained from the equation (4)'.

$$H_{3xy} > 2^{1/2} H_{3x} * (2^{1/2} H_{3y}) \quad (5)$$

That is, the strength of the magnetic field $H_{3xy}$ applied to the magneto-resistance element 7 of the selected memory cell by the ferri-magnetic laminate structure 30 corresponding to the selected memory cell is larger than $2^{1/2}$ times that of the magnetic field $H_{3x}$ applied to the magneto-resistance element 7 contained in the memory cell connected to the selected word line and the non-selected bit line by the ferri-magnetic laminate structure 30 corresponding to the memory cell connected to the selected word line and the non-selected bit line (and the memory cell connected to the non-selected word line and the selected bit line).

Figure 13:
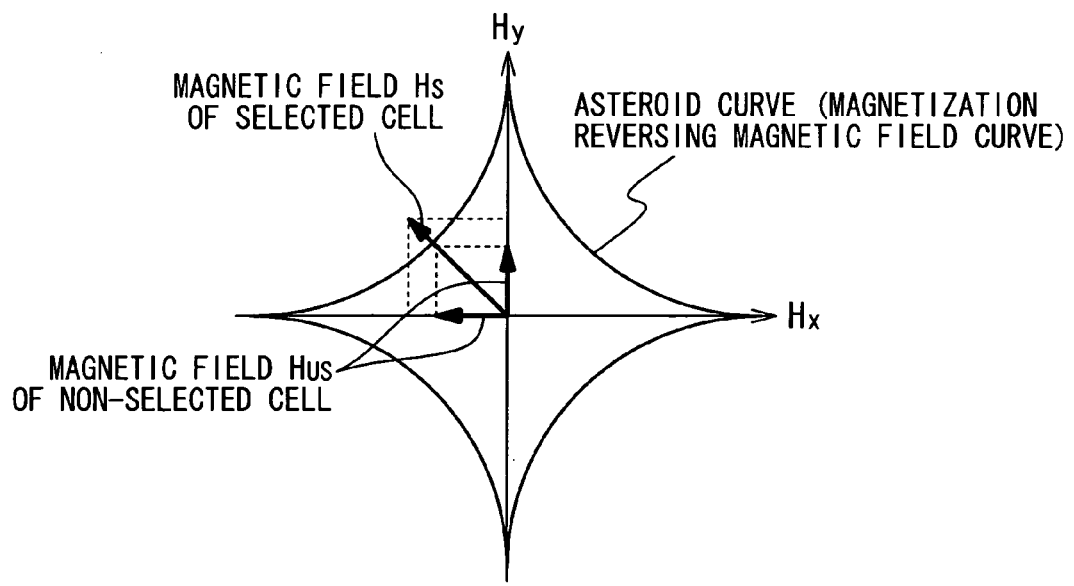
FIG. 13 is a diagram showing a magnetic field Hs applied to the magneto-resistance element contained in the selected memory cell, and a magnetic field $H_{us}$ applied to the magneto-resistance element contained in a memory cell connected to the non-selected word line and a selected bit line.

The equation (5) means that the magnetic field applied to the magneto-resistance element 7 contained in the selected memory cell is notably enhanced as compared with the magnetic field applied to the magneto-resistance element 7 contained in the memory cell connected to the selected word line and the non-selected bit line and the memory cell connected to the non-selected word line and the selected bit line (see FIG. 13). The selectivity of the selected memory cell is improved by selectively and notably enhancing the magnetic field applied to the magneto-resistance element 7 contained in the selected memory cell.

In this way, in the first embodiment, the magnetic field applied to the magneto-resistance element 7 contained in the selected memory cell is selectively and notably enhanced as compared with the magneto-resistance element 7 contained in the memory cell connected to the selected word line and the non-selected bit line and the memory cell connected to the non-selected word line and the selected bit line. The selectivity of the selected memory cell is effectively improved by selectively enhancing the magnetic field applied to the magneto-resistance element 7 contained in the selected memory cell.

In this embodiment, even if a magnetic structure formed of anti-ferromagnetic material film is provided for each of the memory cell 2 instead of the ferri-magnetic laminate structure 30, the same effect should be theoretically acquired. However, actually, since the threshold magnetic field $H_t$ of the anti-ferromagnetic material is extremely large, it is difficult to make the synthetic magnetic field $H_{2xy}$ applied to the magnetic structure corresponding to the selected memory cell larger than the threshold magnetic field $H_t$. It is preferable that the use of the ferri-magnetic laminate structure 30 enables actually the improvement in the selectivity of the selected memory cell through the above operation.

[Second Embodiment]

Figure 14:
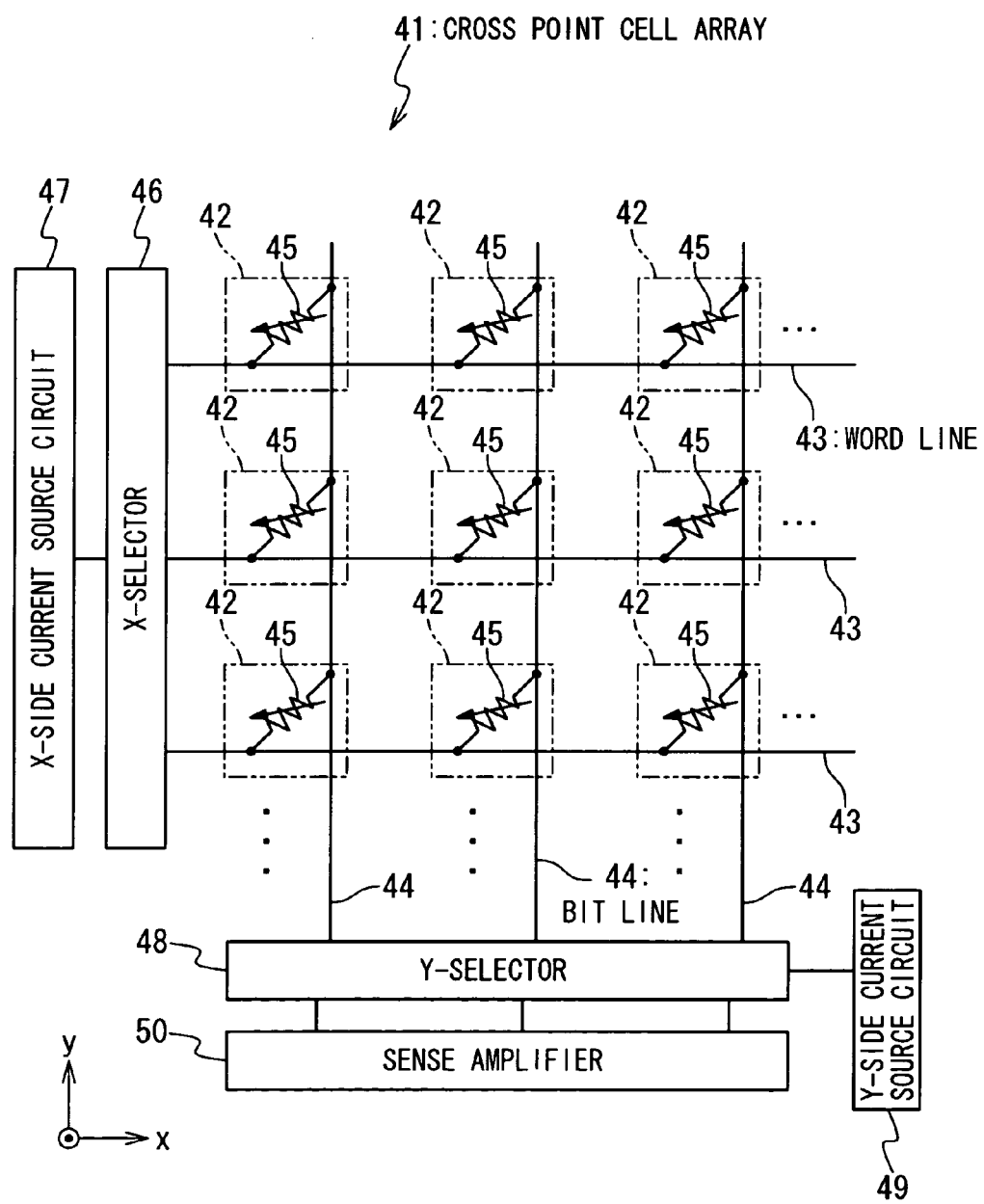
FIG. 14 is a circuit diagram showing the circuit configuration of the MRAM according to a second embodiment of the present invention.

FIG. 14 shows the MRAM according to the second embodiment of the present invention. The MRAM according to the second embodiment has a circuit configuration in which the transistor is not contained in the memory cell, and which contains so called a cross point cell array.

The MRAM according to the second embodiment is provided with the cross point cell array 41 in which the memory cells 42 are arranged in a matrix. Word lines 43 extending in the X axis direction and bit lines 44 extending in the Y axis direction are arranged on the cross point cell array 41. The memory cells 2 are respectively formed at the intersections of the word lines 43 and the bit lines 44. The memory cell 42 contains a magneto-resistance element 45. The magneto-resistance element 45 has reversible spontaneous magnetization and holds data according to the direction of the spontaneous magnetization. Each of the magneto-resistance elements 45 is interposed between the word line 43 and the bit line 44.

The word line 43 is connected to an X selector 46. The X selector 46 selects one of the word lines 43 as the selected word line in the write operation and in the read operation. The X selector 46 is connected to an X side current source circuit 47. The X side current source circuit 47 generates the write current $I_x$, and supplies the write current $I_x$ to the selected write word line.

The bit line 44 is connected to a Y selector 48. The Y selector 48 selects one of plurality of bit lines 44 as the selected bit line in the write operation and in the read operation. The Y selector 48 is connected to a Y side current source circuit 49 and a sense amplifier 50. The Y side current source circuit 49 generates the write current $I_y$, and supplies the generated write current $I_y$ to the selected bit line. The sense amplifier 50 is connected to the selected bit line in the read operation, and distinguishes the data stored in the memory cell 42 from the current flowing through the magneto-resistance element 45.

Figure 15:
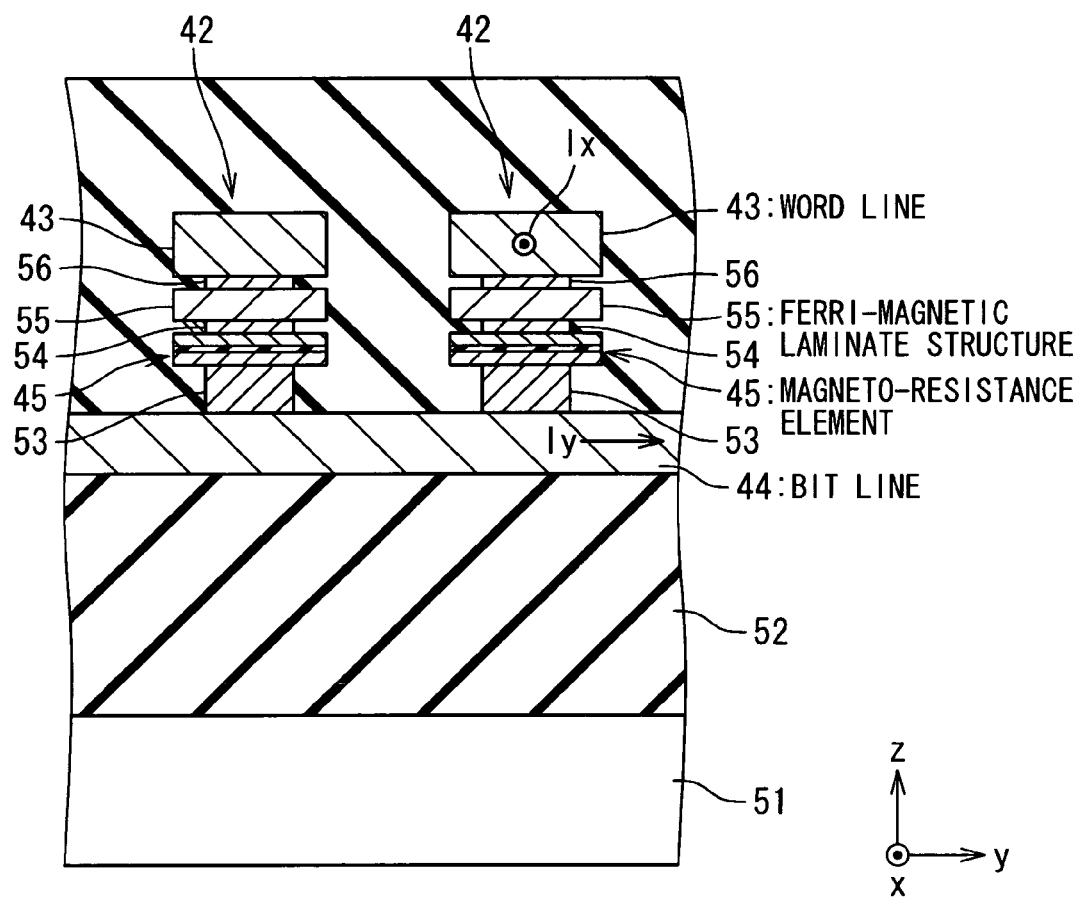
FIG. 15 is a sectional view of the memory cell of the MRAM according to the second embodiment.

FIG. 15 is a sectional view showing the structure of the memory cell 42. With reference to FIG. 15, an interlayer insulating film 52 is formed on a substrate 51. The bit lines 44 are formed on the interlayer insulating film 52. As described above, the bit lines 44 extends in the Y-axis direction. The bit lines 44 are connected to the magneto-resistance element 45 of the respective memory cell 42 through contacts 53.

Figure 16:
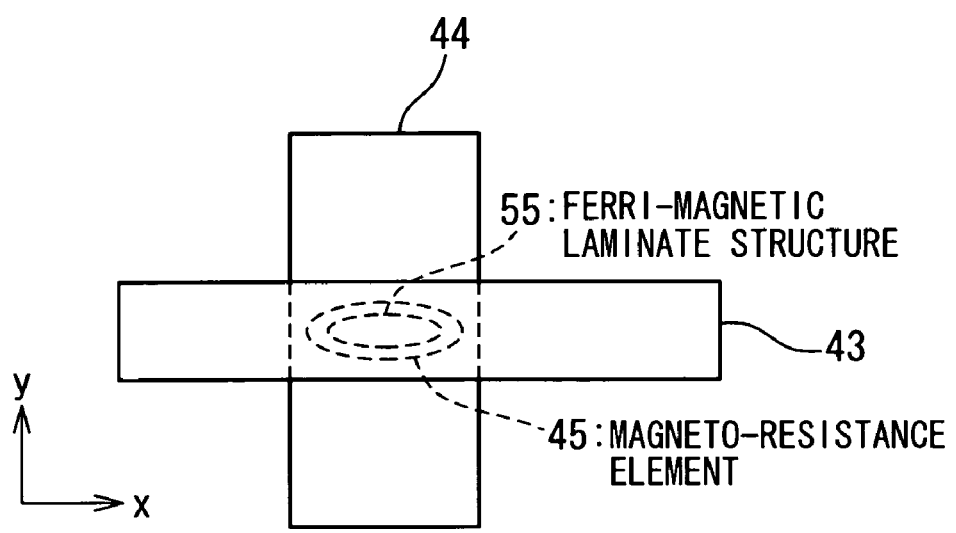
FIG. 16 is a plan view showing the arrangement of the magneto-resistance element and ferri-magnetic laminate structure in the second embodiment.

The magneto-resistance element 45 has the same sectional structure as the magneto-resistance element 7 shown in FIG. 6. That is, the magneto-resistance element 45 is provided with the pinned layer 26 which has the spontaneous magnetization is fixed in the +X axis direction, the free layer 27 which has the spontaneous magnetization whose direction can be reversed in the +X axis direction or in the −X axis direction, and the insulating barrier layer 28 interposed between the pinned layer 27 and the free layer 27. As shown in FIG. 16, the magneto-resistance element 45 has a substantial elliptical plane shape. The long axis of the magneto-resistance element 45 is parallel to the X-axis direction. The structure gives anisotropy direction to the magneto-resistance element 45 such that the directions of the spontaneous magnetization of the pinned layer 26 and the free layer 27 are the X-axis.

As shown in FIG. 15, a ferri-magnetic laminate structure 55 is provided on the magneto-resistance element 45 through a contact 54, and is connected thereto. The ferri-magnetic laminate structure 55 is connected to the word line 43 through a contact 56. As described above, the word line 43 extends in the X-axis direction. The ferri-magnetic laminate structure 55 has the same sectional structure as the ferri-magnetic laminate structure 30 shown in FIGS. 4A to 4C. The ferri-magnetic laminate structure 55 contains the first magnetic layer 31, the second magnetic layer 33, and the non-magnetic spacer layer 32 interposed between the first magnetic layer 31 and the second magnetic layer 33. The film thickness of the non-magnetic spacer layer 32 is selected in such a way that the first magnetic layer 31 is anti-ferromagnetically coupled to the second magnetic layer 33. However, as shown in FIG. 16, the plane structure of the ferri-magnetic laminate structure 55 is different from the plane structure of the ferri-magnetic laminate structure 30. The ferri-magnetic laminate structure 55 has a substantial elliptical plane shape, and the long axis of the ferri-magnetic laminate structure 55 is parallel to the X-axis direction. The anisotropy of the shape of the ferri-magnetic laminate structure 55 gives anisotropy to the magnetic field-magnetization characteristic of the ferri-magnetic laminate structure 55. The anisotropy of the shape of the ferri-magnetic laminate structure 55 makes the direction of the spontaneous magnetization of each of the first magnetic layer 31 and second magnetic layer 33 of the ferri-magnetic laminate structure 55 easy to direct in the X axis direction, and hard to direct in the Y axis direction. However, since the first magnetic layer 31 is anti-ferromagnetically coupled to the second magnetic layer 33, the spontaneous magnetization of the first magnetic layer 31 and second magnetism skin 33 is mutually anti-parallel. The direction into which the spontaneous magnetization directs easily is called an easy axis direction and the direction in which the spontaneous magnetization directs hard is called a hard axis direction. In the second embodiment, the easy axis direction is the X-axis direction, and the hard axis direction is the Y-axis direction.

Figure 17A:
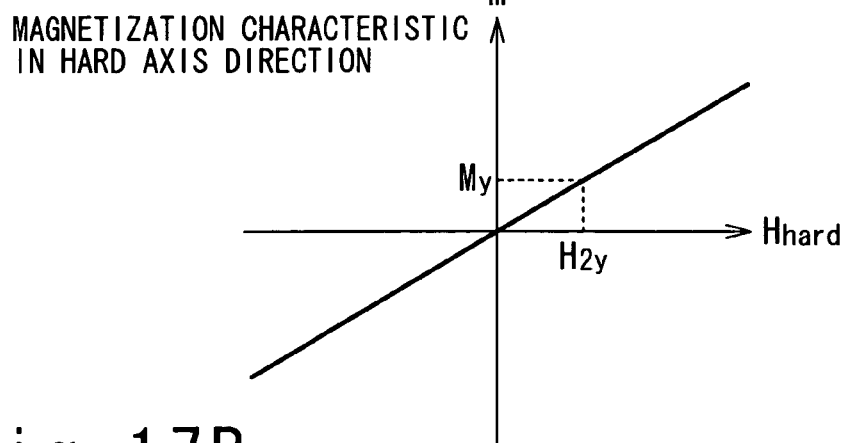
FIG. 17A shows a magnetic field-magnetization characteristic of the ferri-magnetic laminate structure in a hard axis direction in the second embodiment.
Figure 17B:
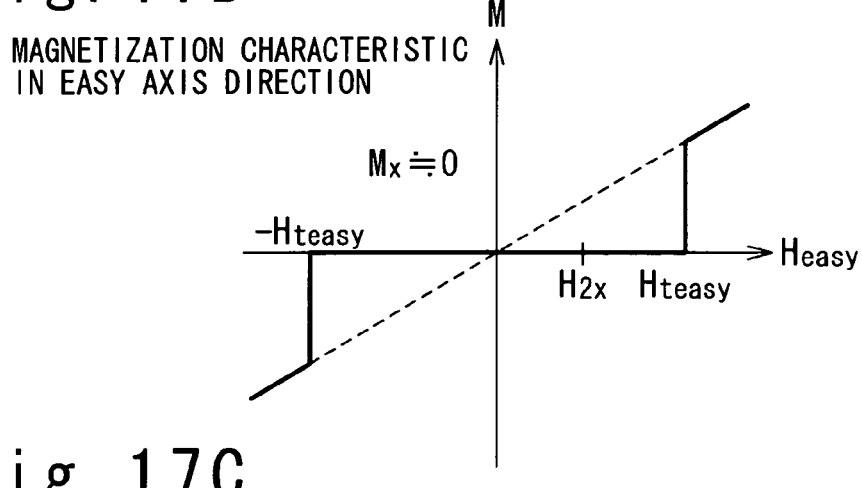
FIG. 17B shows a magnetic field-magnetization characteristic of the ferri-magnetic laminate structure 55 in an easy axis direction.
Figure 17C:
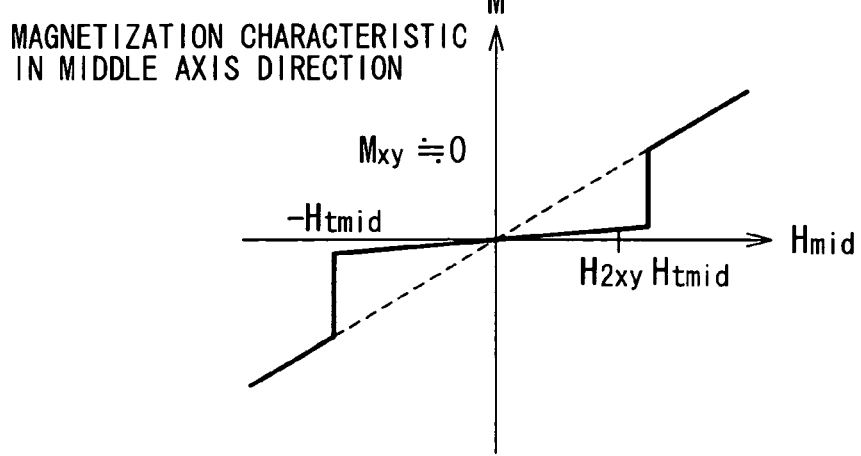
FIG. 17C shows a magnetic field-magnetization characteristic of the ferri-magnetic laminate structure 55 in a middle direction.

FIGS. 17A to 17C show the magnetic field-magnetization characteristic of the ferri-magnetic laminate structure 55. As shown in FIG. 17A, when an external magnetic field $H_{hard}$ is applied into the hard axis direction (Y axis direction), the ferri-magnetic laminate structure 55 shows the linear magnetic field-magnetization characteristic to the external magnetic field $H_{hard}$. On the other hand, as shown in FIG. 17B, when an external magnetic field $H_{easy}$ is applied into the easy axis direction (X axis direction), the ferri-magnetic laminate structure 55 shows different behavior depending on whether the external magnetic field $H_{easy}$ exceeds the threshold magnetic field $H_t$. When the external magnetic field $H_{easy}$ is less than the threshold magnetic field $H_t$, the magnetization is hardly induced, since the anti-ferromagnetical coupling in the ferri-magnetic laminate structure 55 does not break, and the magnetic field of the ferri-magnetic laminate structure 55 is substantially 0. On the other hand, in the threshold magnetic field $H_t$, the magnetization of the ferri-magnetic laminate structure 55 increases discontinuously or discretely, and the magnetization of the ferri-magnetic laminate structure 55 increases linearly to the external magnetic field $H_{easy}$ in the region where the external magnetic field $H_{easy}$ has exceeds the threshold magnetic field $H_t$. FIG. 17B shows an ideal characteristic of the ferri-magnetic laminate structure 55. However, a characteristic close to this ideal characteristic can be applied to the ferri-magnetic laminate structure 55 by enhancing the anisotropy of the ferri-magnetic laminate structure 55. When an external magnetic field $H_{mid}$ is applied in the direction (middle direction) between the hard axis direction and the easy axis direction, as shown in FIG. 17C, the ferri-magnetic laminate structure 55 shows a magnetic field-magnetization characteristic in which the magnetic field-magnetization characteristic shown in FIG. 17A is blended with the magnetic field-magnetization characteristic shown in FIGS. 17B. When the external magnetic field $H_{mid}$ which is smaller than the threshold magnetic field $H_t$ is applied in the middle direction, the magnetization is delicately and linearly induced to the external magnetic field $H_{mid}$ in the ferri-magnetic laminate structure 55. In the threshold magnetic field $H_{tmid}$, the magnetization of the ferri-magnetic laminate structure 55 increases discretely, and the magnetization of the ferri-magnetic laminate structure 55 increases linearly to the external magnetic field $H_{mid}$ in the region where the magnetization of the external magnetic field $H_{mid}$ exceeds that of the threshold magnetic field $H_{tmid}$. The increasing rate of the magnetization of the ferri-magnetic laminate structure 55 in the region where the external magnetic field $H_{mid}$ exceeds the threshold magnetic field $H_{tmid}$ is larger than that of the magnetization of the ferri-magnetic laminate structure 55 in the region where the external magnetic field $H_{mid}$ is less than the threshold magnetic field $H_{tmid}$. The threshold magnetic field $H_t$ of the magnetic field-magnetization characteristic of the middle direction is smaller than the threshold magnetic field $H_t$ of the magnetic field-magnetization characteristic in the easy axis direction. The threshold magnetic field $H_t$ of the magnetic field-magnetization characteristic of the middle direction is smaller as the direction of an external magnetic field is away from the easy axis direction. Therefore, the locus ($H_t$ curve) of the threshold magnetic field $H_t$ to the external magnetic field $H_{mid}$ has a shape shown in FIGS. 19A to 19C.

In the same manner as the first embodiment, the region where a magnetic field is larger than the threshold magnetic field $H_t$ is defined as the linear magnetization region, and the region where the magnetic field is smaller than the threshold magnetic field $H_t$ is defined as the non-linear magnetization region. However, since the magnetization increases linearly to the magnetic field in despite of the strength of the magnetic field when the magnetic field is applied in the hard axis direction, it is considered that the threshold magnetic field $H_t$ in the hard axis direction is 0. That is, in the hard axis direction, the magnetic field having an arbitrary strength exists in the linear magnetization region.

In the second embodiment, the selectivity of the selected memory cell is improved by the ferri-magnetic laminate structure 55 having the above characteristic. Hereinafter, the detail will be described.

With reference to FIG. 14, the write operation of the MRAM according to the second embodiment is started through the selection of the selected memory cell. One of the word lines 43 is selected as a selected word line by the X selector 46, and one of the bit lines 44 is selected as a selected bit line by the Y selector 48. The memory cell 42 of the cross point of the selected word line and the selected bit line is selected as a selected memory cell. In the same manner as the first embodiment, one of the memory cells 42 which is connected to the selected bit line and is not connected to the selected word line is described as a non-selected memory cell and one the memory cells 42 which is connected to the selected word line and is not connected to the selected bit line is described as a non-selected memory cell. After selection of the selected word line and the selected bit line, the write current $I_x$ is flowed in the +X axis direction through the selected word line by the X side current source circuit 47, and the write current $I_y$ is flowed in the +Y axis direction or the −Y axis direction through the selected bit line by the Y side current source circuit 49. The direction of the write current $I_y$ is determined according to the data written in the selected memory cell.

Figure 18:
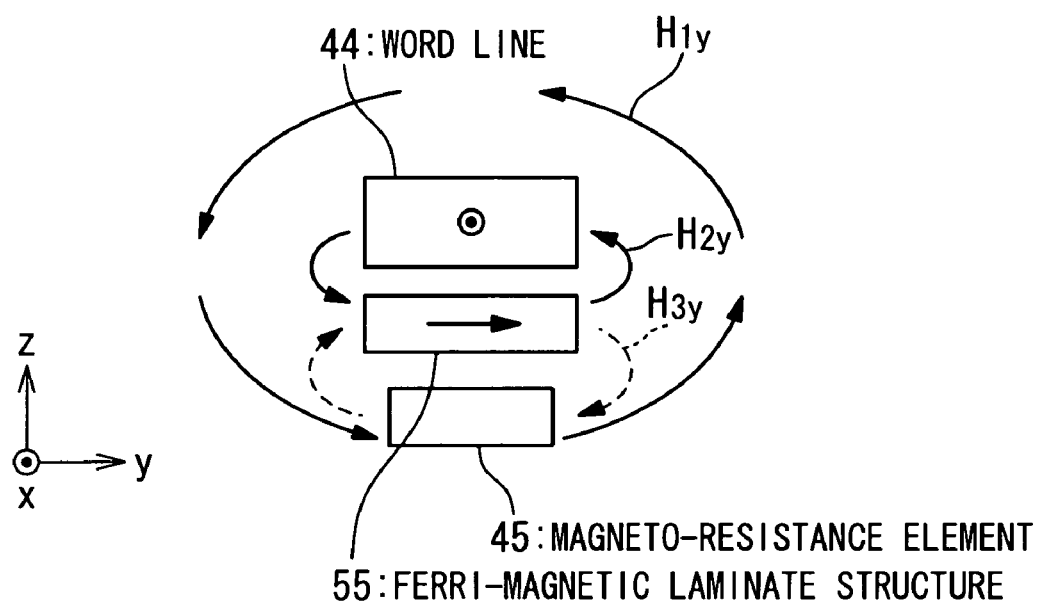
FIG. 18 shows magnetic fields $H_{1y}$, $H_{2y}$, and $H_{3y}$ applied to the magneto-resistance element in the second embodiment.

With reference to FIG. 18, the magnetic field $H_{1y}$ of the +Y axis direction is applied to the magneto-resistance element 45 of the memory cell connected to the selected word line and the non-selected bit line by the write current $I_x$ flowing in the +X axis direction. Also, the magnetic field $H_{1x}$ of the −X axis direction (or +X axis direction) is applied to the magneto-resistance element 45 of the memory cell connected to the non-selected word line and the selected bit line by the write current $I_y$ flowing in the +Y axis direction (or −Y axis direction). Further, a synthetic magnetic field $H_{1xy}$ of the above magnetic field $H_{1x}$ and the magnetic field $H_{1y}$ is applied to the magneto-resistance element 45 of the selected memory cell. The magneto-resistance element 45 and the ferri-magnetic laminate structure 55 are provided between the word line 43 and the bit line 44. Thereby, the ferri-magnetic laminate structure 55 functions to weaken the magnetic field applied to the magneto-resistance element 45 of the memory cell connected to the selected word line and the non-selected bit line, and the memory cell connected to the non-selected word line and the selected bit line, and the selected memory cell, when the write current $I_x$ and the write current $I_y$ flow.

Hereinafter, the memory cell connected to the selected word line and the non-selected bit line will be described.

With reference to FIG. 18, the write current $I_x$ flowing through the selected word line in the +X axis direction applies the magnetic field $H_{1y}$ of the +Y axis direction to the magneto-resistance element 45 of the memory cell connected to the selected word line and the non-selected bit line. Further, the write current $I_x$ applies the magnetic field $H_{2y}$ of the +Y axis direction to the ferri-magnetic laminate structure 55 provided in correspondence to the memory cell connected to the selected word line and the non-selected bit line. The magnetic field $M_y$ is induced in the +Y axis direction in the ferri-magnetic laminate structure 55 by applying the magnetic field $H_{2y}$. The magnetization $M_y$ induced in the ferri-magnetic laminate structure 55 applies the magnetic field $H_{3y}$ to the magneto-resistance element 45 of the memory cell connected to the selected word line and the non-selected bit line. When the magneto-resistance element 45 and the ferri-magnetic laminate structure 55 are located at the same side of the selected word line, the direction of the magnetic field $H_{3y}$ is the −Y axis direction opposite to the magnetic field $H_{1y}$. Therefore, the ferri-magnetic laminate structure 55 functions to weaken the magnetic field applied to the magneto-resistance element 45 of the memory cell connected to the selected word line and the non-selected bit line when the write current $I_x$ is flowed through the selected word line.

From the same prospect, it could be understood that the ferri-magnetic laminate structure 55 provided for each of the memory cell connected to the non-selected word line and the selected bit line and the selected memory cell functions to weaken the magnetic field applied to the magneto-resistance element 45 of the memory cell connected to the non-selected word line and the selected bit line and the selected memory cell.

In the MRAM due to the second embodiment, the magnetic field applied to the magneto-resistance element 45 contained in the memory cell connected to the selected word line and the non-selected bit line by using the magnetic field-magnetization characteristic of the ferri-magnetic laminate structure 55 described above is notably weakened as compared with the magnetic field applied to the magneto-resistance element 45 contained in the selected memory cell. This operation enhances the selectivity of the selected memory cell to the memory cell connected to the selected word line and the non-selected bit line effectively. Hereinafter, the improvement in the selectivity of the selected memory cell using the magnetic field-magnetization characteristic of the ferri-magnetic laminate structure 55 will be described in detail.

With reference to FIGS. 17A to 17C, in the second embodiment, the ferri-magnetic laminate structure 55 corresponding to the selected memory cell, the ferri-magnetic laminate structure 55 corresponding to the memory cell connected to the selected word line and the non-selected bit line, and the ferri-magnetic laminate structure 55 corresponding to the memory cell connected to the non-selected word line and the selected bit line have mutually different magnetic field-magnetization characteristics. The synthetic magnetic field $H_{2xy}$ of the magnetic field $H_{2x}$ of the X axis direction (easy axis direction) generated by the write current $I_y$ flowing through the selected bit line and the magnetic field $H_{2y}$ of the Y axis direction (hard axis direction) generated by the write current $I_x$ flowing through the selected word line is applied to the ferri-magnetic laminate structure 55 corresponding to the selected memory cell. Therefore, the magnetic field is applied in the middle direction to the ferri-magnetic laminate structure 55 corresponding to the selected memory cell. Thus, the ferri-magnetic laminate structure 55 corresponding to the selected memory cell has the magnetic field-magnetization characteristic shown in FIG. 17C.

On the other hand, since only the magnetic field $H_{2y}$ of the Y axis direction (hard axis direction) is applied to the ferri-magnetic laminate structure 55 corresponding to the memory cell connected to the selected word line and the non-selected bit line, the ferri-magnetic laminate structure 55 corresponding to the memory cell connected to the selected word line and the non-selected bit line has the magnetic field-magnetization characteristic shown in FIG. 17A. Further, since only the magnetic field $H_{2x}$ of the X axis direction (easy axis direction) is applied to the ferri-magnetic laminate structure 55 corresponding to the memory cell connected to the non-selected word line and the selected bit line, the ferri-magnetic laminate structure 55 corresponding to the memory cell connected to the non-selected word line and the selected bit line has the magnetic field-magnetization characteristic shown in FIG. 17B. When the ferri-magnetic laminate structure 55 has such a characteristic, the large magnetization can be induced in only the ferri-magnetic laminate structure 55 corresponding to the memory cell connected to the selected word line and the non-selected bit line by determining the magnitudes of write currents $I_x$ and $I_y$ so as to satisfy the following conditional equations (6-1) and (6-2).

$$H_{2x} < H_{teasy} \tag{6-1}$$

$$H_{2xy} < H_{tmid} \tag{6-2}$$

Herein, the $H_{teasy}$ is a threshold in the easy axis direction, and the $H_{tmid}$ is a threshold in the direction of the synthetic magnetic field $H_{2xy}$ (middle direction).

The magnetic field $H_{2y}$ is applied to the ferri-magnetic laminate structure 55 corresponding to the memory cell connected to the selected word line and the non-selected bit line in the hard axis direction (Y axis direction). That is, as shown in FIG. 17B, the magnetic field $H_{2y}$ is in a linear magnetization region. Therefore, the magnetization $M_y$, which increases linearly to the magnetic field $H_{2y}$, is induced in the ferri-magnetic laminate structure 55 corresponding to the memory cell connected to the selected word line and the non-selected bit line as shown in FIG. 17A.

Figure 19A:
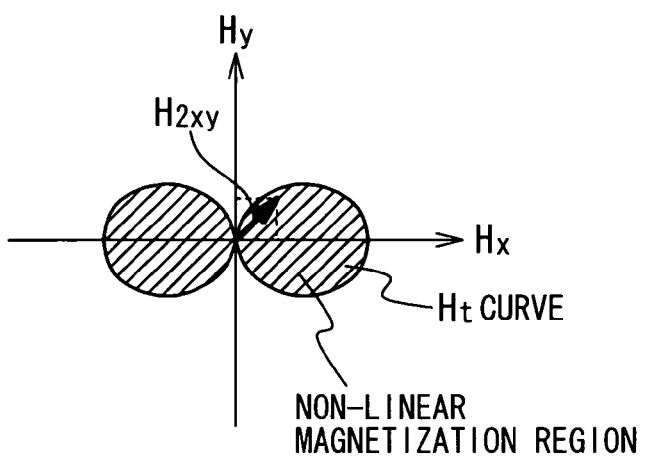
FIG. 19A shows a synthetic magnetic field $H_{2xy}$ applied to the ferri-magnetic laminate structure corresponding to a selected memory cell.
Figure 19B:
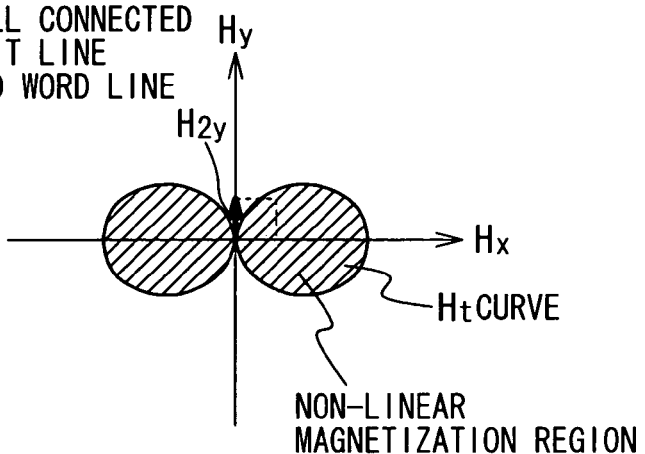
FIG. 19B shows a magnetic field $H_{2y}$ applied to the ferri-magnetic laminate structure corresponding to the memory cell connected to a selected word line and a non-selected bit line.
Figure 19C:
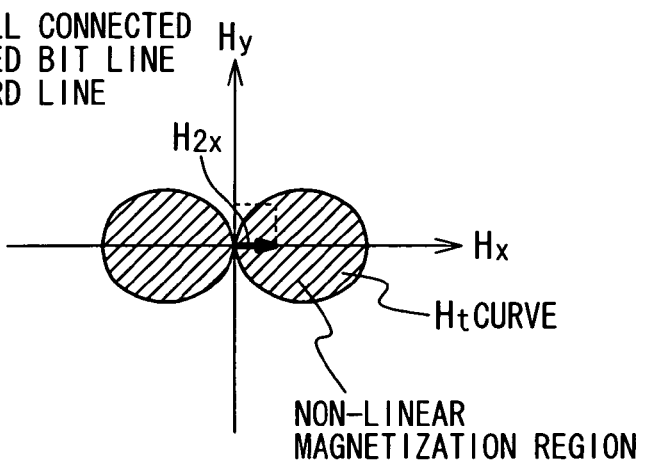
FIG. 19C shows a synthetic magnetic field $H_{2x}$ applied to the ferri-magnetic laminate structure corresponding to the memory cell connected to a non-selected word line and a selected bit line.

On the other hand, as shown in the equation (6-1), the magnetic field $H_{2x}$ which is smaller than the threshold magnetic field $H_{teasy}$ is applied to the ferri-magnetic laminate structure 55 corresponding to the memory cell connected to the non-selected word line and the selected bit line in the easy axis direction (X axis direction). That is, as shown in FIG. 19C, the magnetic field $H_{2x}$ is in a non-linear magnetization region. Therefore, the magnetization $M_x$ induced in the ferri-magnetic laminate structure 55 corresponding to the selected memory cell is extremely small as shown in FIG. 17B. Further, as shown in the equation (6-2), the magnetic field $H_{2xy}$ which is smaller than the threshold magnetic field $H_{tmid}$ is applied to the ferri-magnetic laminate structure 55 corresponding to the selected memory cell in the middle direction. That is, as shown in FIG. 19A, the magnetic field $H_{2xy}$ is in the non-linear magnetization region. Therefore, the magnetization $M_{xy}$ induced in the ferri-magnetic laminate structure 55 corresponding to the selected memory cell is extremely small.

From the above consideration, it could be understood that the following equation (7) is satisfied by satisfying the equations (6-1) and (6-2):

$$M_y/H_{2y} >> M_x/H_{2x} \ (\square 0)$$

$$M_y/H_{2y} >> M_{xy}/H_{2xy} \ (\square 0) \quad (7)$$

The equation (7) means that the effectual magnetic susceptibility $\chi_y (=M_y/H_{2y})$ of the ferri-magnetic laminate structure 55 corresponding to the memory cell connected to the selected word line and the non-selected bit line is notably larger than the effectual magnetic susceptibilities $\chi_{xy} (=M_{xy}/H_{2xy})$ and $\chi_x (=M_x/H_{2x})$ of the ferri-magnetic laminate structure 55 corresponding to the selected memory cell and the memory cell connected to the non-selected word line and the selected bit line.

The magnetic field applied to the magneto-resistance element 45 by the ferri-magnetic laminate structure 55 is proportional to the magnitude of the magnetization induced in the ferri-magnetic laminate structure 55. Therefore, the equation (7) means that the magnetic field which is notably larger than the ferri-magnetic laminate structure 55 corresponding to the selected memory cell and the memory cell connected to the non-selected word line and the selected bit line is applied to the magneto-resistance element 45 in the ferri-magnetic laminate structure 55 corresponding to the memory cell connected to the selected word line and the non-selected bit line. At this time, the $H_{teasy}$, the $H_{thard}$ and the $H_{tmid}$ function as threshold functions.

Figure 20:
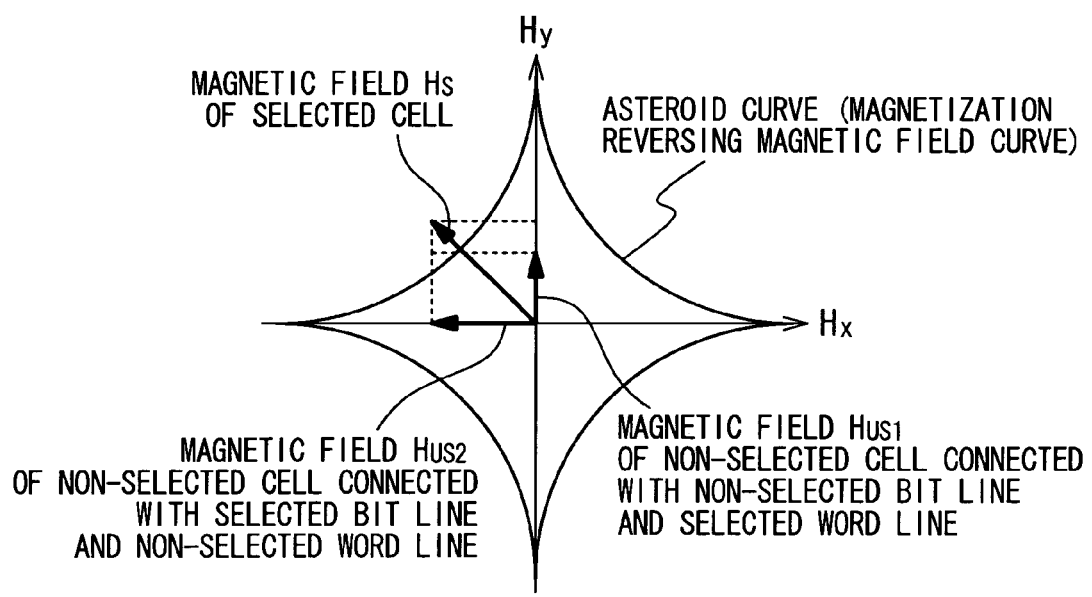
FIG. 20 shows a magnetic field Hs applied to the magneto-resistance element contained in the selected memory cell, a magnetic field $H_{us1}$ applied to the magneto-resistance element contained in the memory cell connected to the selected word line and the non-selected bit line, and a magnetic field $H_{us2}$ applied to the magneto-resistance element contained in the memory cell connected to the non-selected word line and the selected bit line.

As described above, since the magnetic field applied to the magneto-resistance element 45 by the ferri-magnetic laminate structure 55 functions to weaken the magnetic field applied to the magneto-resistance element 45 by the write currents $I_x$ and $I_y$, as shown in FIG. 20, the magnetic field $H_{us1}$ applied to the magneto-resistance element 45 contained in the memory cell connected to the selected word line and the non-selected bit line is weakened more notably than the magnetic field $H_s$ applied to the magneto-resistance element 45 contained in the selected memory cell. Thereby, the selectivity of the selected memory cell to the memory cell connected to the selected word line and the non-selected bit line is effectively improved. However, in the MRAM due to the second embodiment, the selectivity of the selected memory cell to the memory cell connected to the non-selected word line and the selected bit line is not improved as shown in the principle of the improvement in the above selectivity.

As described above, in the MRAM due to the second embodiment, the magnetic field applied to the magneto-resistance element 45 contained in the memory cell connected to the selected word line and the non-selected bit line is notably weakened compared with the magnetic field applied to the magneto-resistance element 45 contained in the selected memory cell. Thereby, the selectivity of the selected memory cell to the memory cell connected to the selected word line and the non-selected bit line is relatively improved.

In the second embodiment, the selectivity of the selected memory cell can be improved to the memory cell connected to the selected word line and the non-selected bit line instead of the selectivity of the selected memory cell to the memory cell connected to the non-selected word line and the selected bit line by setting the long axis of the ferri-magnetic laminate structure 55 to parallel to the Y axis direction. However, as this embodiment, it is preferable to set the long axis of the ferri-magnetic laminate structure 55 to parallel to the X-axis direction. The spontaneous magnetization of the pinned layer 26 and the free layer 28 of the magneto-resistance element 45 is directed into the X-axis direction as described above. The directing the directions of the spontaneous magnetizations of the pinned layer 26 and free layer 28 in the X-axis direction is carried out by applying the external magnetic field in the X-axis direction during the manufacturing process of the MRAM. The application of the external magnetic field to the X axis direction gives the anisotropy of the X axis direction to the ferri-magnetic laminate structure 55, and brings the magnetic field-magnetization characteristic of the easy axis direction of the ferri-magnetic laminate structure 55 close to the ideal characteristic shown in FIG. 14B. This is extremely preferable for improving the selectivity of the selected memory cell to the memory cell connected to the selected word line and the non-selected bit line.

[Third Embodiment]

Figure 21:
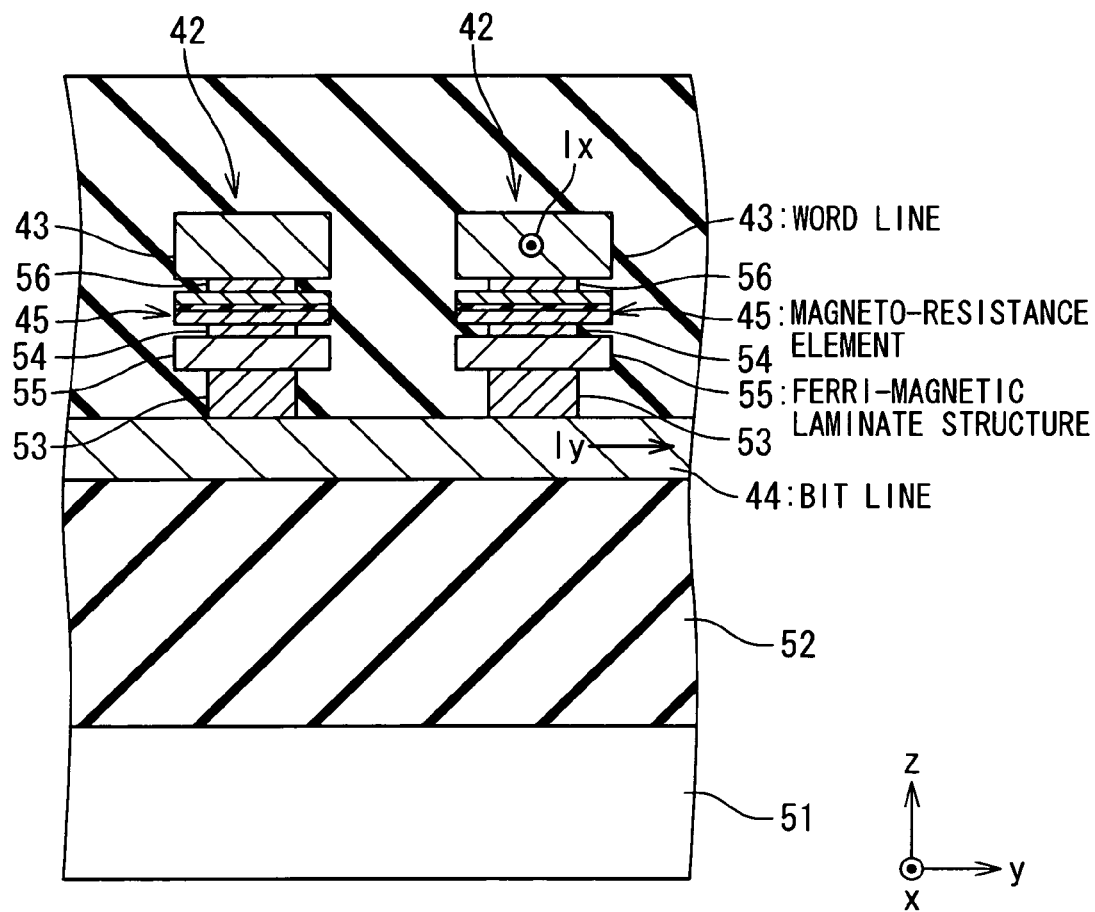
FIG. 21 is a sectional view of the memory cell of the MRAM according to a third embodiment of the present invention.
Figure 22:
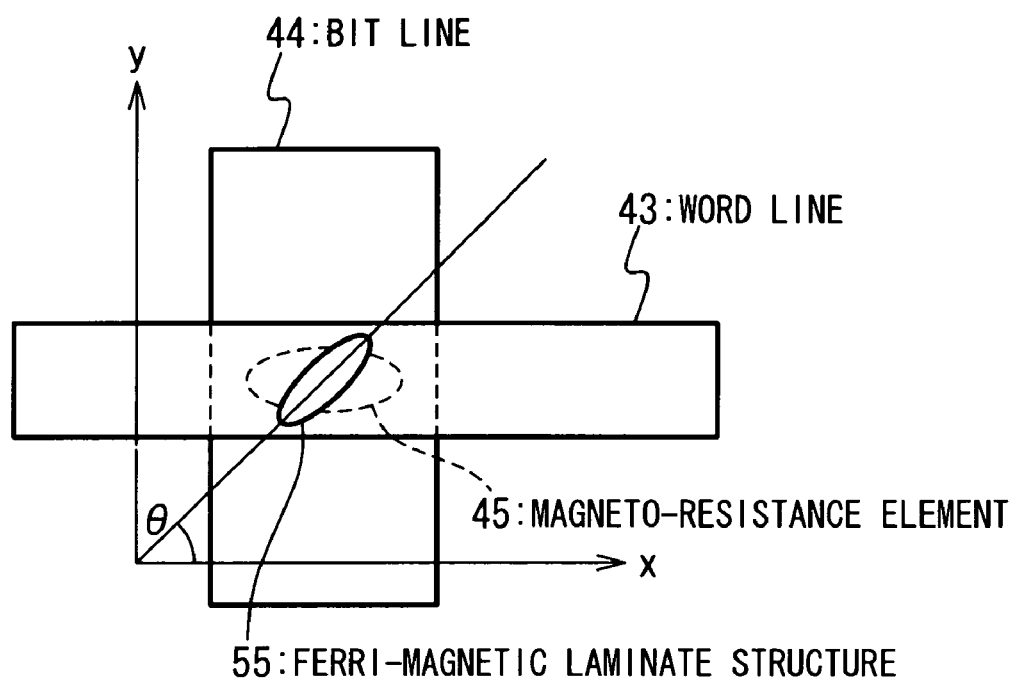
FIG. 22 is a plan view showing the arrangement of the magneto-resistance element and the ferri-magnetic laminate structure in the third embodiment.
Figure 23A:
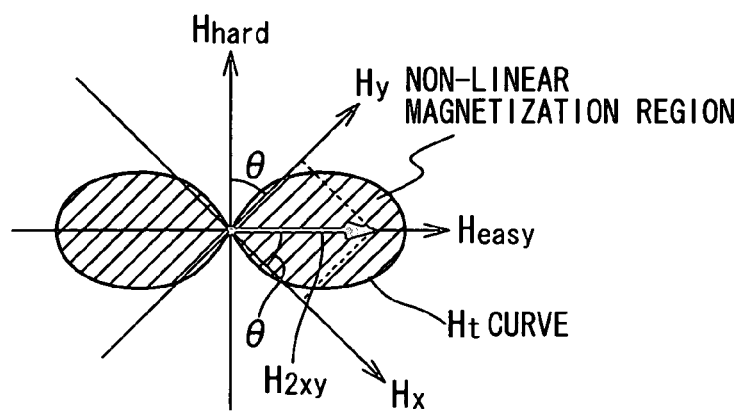
FIG. 23A is a diagram showing a synthetic magnetic field $H_{2xy}$ applied to the ferri-magnetic laminate structure corresponding to the selected memory cell in the third embodiment.
Figure 23B:
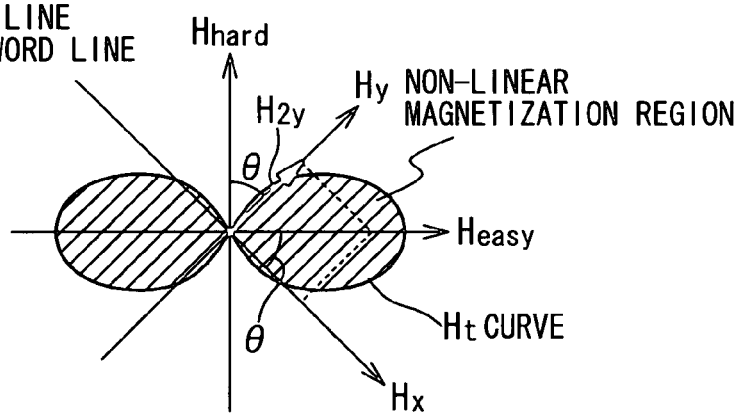
FIG. 23B is a diagram showing a synthetic magnetic field $H_{2y}$ applied to the ferri-magnetic laminate structure corresponding to the memory cell connected to the selected word line and the non-selected bit line.
Figure 23C:
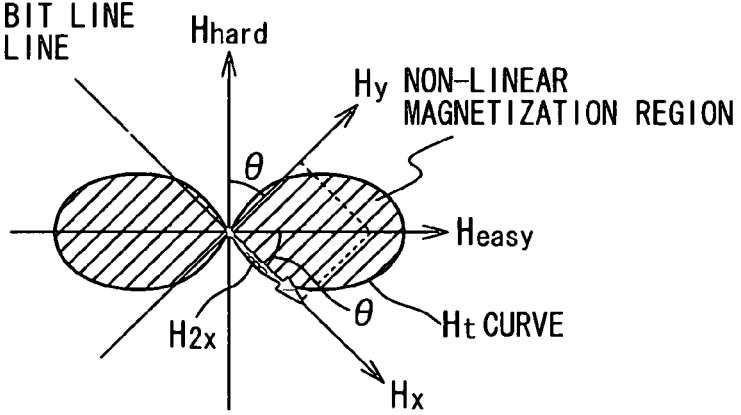
FIG. 23C is a diagram showing a synthetic magnetic field $H_{2x}$ applied to the ferri-magnetic laminate structure corresponding to the memory cell connnected to the non-selected word line and the selected bit line.

Next, with reference to FIGS. 21 and 22, the MRAM due to the third embodiment of the present invention will be described. As shown in FIGS. 21 and 22, in the MRAM due to the third embodiment, the arrangement of the magneto-resistance element 45 and the ferri-magnetic laminate structure 55 are changed. As shown in FIG. 21, in the sectional structure of the memory cell 42, the positions of the magneto-resistance element 45 and the ferri-magnetic laminate structure 55 are exchanged. As shown in FIG. 22, the ferri-magnetic laminate structure 55 has a substantial elliptical plane shape. The long axis of the ferri-magnetic laminate structure 55 is inclined by an angle θ from the X-axis. Typically, the angle θ is 45 degrees. The structure of other portion of the MRAM according to the third embodiment is the same as the second embodiment. The circuit of the MRAM according to the third embodiment is the same as the circuit of the MRAM according to the second embodiment shown in FIG. 14. As shown in FIGS. 23A to 23C, the easy axis direction and hard axis direction of the ferri-magnetic laminate structure 55 are also inclined by an angle θ by inclining the ferri-magnetic laminate structure 55 by the angle θ from the X axis direction. The easy axis direction of the ferri-magnetic laminate structure 55 is a direction having an angle θ with the +X axis direction, and the hard axis direction of the ferri-magnetic laminate structure 55 is a direction of an angle θ from the +Y axis direction. Herein, the magnetic field $H_x$ shown in FIG. 23A to 23C is the magnetic field of the +X axis direction, the magnetic field $H_y$ is the magnetic field of the +Y axis direction, and the $H_{easy}$ is the magnetic field of the easy axis direction, and the $H_{hard}$ is the magnetic field of the hard axis direction. The threshold magnetic field $H_t$ becomes the largest in the ferri-magnetic laminate structure 55 when the magnetic field is applied in the easy axis direction. When the magnetic field is applied in the hard axis direction, the threshold magnetic field $H_t$ is substantially 0. In the same manner as the second embodiment, the ferri-magnetic laminate structure 55 shows the magnetic field-magnetization characteristics which are different to the easy axis direction, the hard axis direction and the middle direction, as shown in FIGS. 17A to 17C.

In the write operation of the MRAM according to the third embodiment, the selectivity of the selected memory cell to both the memory cell connected to the selected word line and the non-selected bit line and the memory cell connected to the non-selected word line and the selected bit line is improved by using the characteristic of the ferri-magnetic laminate structure 55.

In the MRAM according to the third embodiment, the write currents $I_x$ and $I_y$ flow through the selected word line and the selected bit line, respectively so as to satisfy one of the following conditions.

Condition A:

The write current $I_x$ of the +X axis direction flow in the selected word line, and the write current $I_y$ of the +Y axis direction flows through the selected bit line.

Condition B:

The write current $I_x$ of the −X axis direction flows through the selected word line, and the write current $I_y$ of the −Y axis direction flows through the selected bit line. The selection of any of the conditions A and B is determined according to the data to be written. In this embodiment, when "0" is written in the selected memory cell, the condition A is selected and when "1" is written in the selected memory cell, the condition B is selected. The write current $I_x$ and the write current $I_y$ flow, and thereby, the magnetic field is applied to the magneto-resistance element 45 contained in the memory cell connected to the selected word line and the non-selected bit line, the memory cell connected to the non-selected word line and the selected bit line and the selected memory cell. As described in the second embodiment, since the magneto-resistance element 45 and the ferri-magnetic laminate structure 55 are located between the word line 43 and the bit line 44, the ferri-magnetic laminate structure 55 functions to weaken the magnetic field applied to the magneto-resistance element 45 of the memory cell connected to the selected word line and the non-selected bit line, the memory cell connected to the non-selected word line and the selected bit line and the selected memory cell when the write current $I_x$ and the write current $I_y$ are flowed.

In the MRAM according to the third embodiment, the magnetic field is applied to the magneto-resistance element 45 contained in the memory cell connected to the selected word line and the non-selected bit line and the memory cell connected to the non-selected word line and the selected bit line by using the magnetic field-magnetization characteristic of the ferri-magnetic laminate structure 55 described above. The magnetic field at this time is notably weakened compared with the magnetic field applied to the magneto-resistance element 45 contained in the selected memory cell. This operation effectively enhances the selectivity of the selected memory cell to both the memory cell connected to the selected word line and the non-selected bit line and the memory cell connected to the non-selected word line and the selected bit line. Hereinafter, the improvement in the selectivity of the selected memory cell using the magnetic field-magnetization characteristic of the ferri-magnetic laminate structure 55 will be described in detail.

Hereinafter, the case where "0" is written in the selected memory cell will be described. When "0" is written in the selected memory cell, the magnetic field $H_{2y}$ is applied to the ferri-magnetic laminate structure 55 corresponding to the memory cell connected to the selected word line and the non-selected bit line in the +Y axis direction by the write current $I_x$ of the +X axis direction. As shown in FIG. 23B, the magnetic field $H_{2y}$ faces the middle direction between the easy axis direction and the hard axis direction. Further, the magnetic field $H_{2x}$ is applied in the +X axis direction in the ferri-magnetic laminate structure 55 corresponding to the memory cell connected to the non-selected word line and the selected bit line by the write current $I_y$ of the +Y axis direction. As shown in FIG. 23C, the magnetic field $H_{2x}$ is directed to the middle direction between the easy axis direction and the hard axis direction. The synthetic magnetic field $H_{2xy}$ of the magnetic field $H_{2x}$ of the +X axis direction and magnetic field $H_{2y}$ of the +Y axis direction is applied to the ferri-magnetic laminate structure 55 corresponding to the selected memory cell. The magnitudes of the write current $I_x$ and the write current $I_y$ are determined in such a way that the direction of the synthetic magnetic field $H_{2xy}$ applied to the magneto-resistance element 55 corresponding to the selected memory cell is substantially coincident with the easy axis direction of the magneto-resistance element 55, that is, the synthetic magnetic field $H_{2xy}$ is directed into a direction of an angle θ from the X axis direction substantially.

In this way, when the magnitudes of the write current $I_x$ and write current $I_y$ are determined, as shown in FIG. 23A, the synthetic magnetic field $H_{2xy}$ directed to the easy axis direction is applied to the ferri-magnetic laminate structure 55 corresponding to the selected memory cell. Therefore, the ferri-magnetic laminate structure 55 corresponding to the selected memory cell shows the magnetic field-magnetization characteristic shown in FIG. 17B. On the other hand, only the magnetic field $H_{2y}$ of the middle direction is applied to the ferri-magnetic laminate structure 55 corresponding to the memory cell connected to the selected word line and the non-selected bit line. Therefore, the ferri-magnetic laminate structure 55 corresponding to the memory cell connected to the selected word line and the non-selected bit line shows the magnetic field-magnetization characteristic shown in FIG. 17C.

Similarly, only the magnetic field $H_{2x}$ of the middle direction is applied to the ferri-magnetic laminate structure 55 corresponding to the memory cell connected to the non-selected word line and the selected bit line. Therefore, the ferri-magnetic laminate structure 55 corresponding to the memory cell connected to the non-selected word line and the selected bit line shows the magnetic field-magnetization characteristic shown in FIG. 17C. At this time, the write current $I_x$ and the write current $I_y$ are determined in such a way that the following conditions (8-1), (8-2) and (8-3) are satisfied to improve the selectivity of the selected memory cell at this time.

$$H_{2x} > H_{tx} \quad (8\text{-}1)$$

$$H_{2y} > H_{ty} \quad (8\text{-}2)$$

$$H_{2xy} < H_{teasy} \quad (8\text{-}3)$$

Herein, $H_{teasy}$ is a threshold for the easy axis direction, $H_{tx}$ is a threshold for the direction (middle direction) of the magnetic field $H_{2x}$, and $H_{ty}$ is a threshold for the direction (middle direction) of the magnetic field $H_{2y}$. Although the strength of the synthetic magnetic field $H_{2xy}$ is larger than those of the magnetic field $H_{2x}$ and the magnetic field $H_{2y}$, the write current $I_x$ and the write current $I_y$ can be determined such that the equations (8-1) to (8-3) are satisfied since the threshold magnetic field $H_{teasy}$ for the easy axis direction is larger than the threshold magnetic fields $H_{tx}$ and $H_{ty}$ for the middle direction.

According to the equation (8-1), the magnetic field $H_{2x}$ which is larger than the threshold magnetic field $H_{tx}$ is applied to the ferri-magnetic laminate structure 55 corresponding to the memory cell connected to the non-selected word line and the selected bit line in the middle direction. That is, as shown in FIG. 23C, the magnetic field $H_{2x}$ is in a linear magnetization region. Therefore, the magnetization $M_x$ increasing linearly to the magnetic field $H_{2x}$ is generated in the ferri-magnetic laminate structure 55 corresponding to the memory cell connected to the non-selected word line and the selected bit line as shown in FIG. 17C.

Similarly, according to the equation (8-2), the magnetic field $H_{2y}$ which is larger than the threshold magnetic field $H_{ty}$, is applied in the middle direction to the ferri-magnetic laminate structure 55 corresponding to the memory cell connected to the selected word line and the non-selected bit line. That is, as shown in FIG. 23B, the magnetic field $H_{2x}$ is in the linear magnetization region. Therefore, the magnetization $M_y$ increasing linearly to the magnetic field $H_{2y}$ is induced in the ferri-magnetic laminate structure 55 corresponding to the memory cell connected to the selected word line and the non-selected bit line as shown in FIG. 14C.

On the other hand, as shown in the equation (8-3), the synthetic magnetic field $H_{2xy}$ which is smaller than the threshold magnetic field $H_{teasY}$ is applied in the easy axis direction to the ferri-magnetic laminate structure 55 corresponding to the selected memory cell. That is, as shown in FIG. 23A, the synthetic magnetic field $H_{2xy}$ is in the non-linear magnetization region. Therefore, the magnetization $M_{xy}$ induced in the ferri-magnetic laminate structure 55 corresponding to the selected memory cell is extremely small.

From the above consideration, it could be understood that the following equation (9) is satisfied by satisfying the equations (8-1) to (8-3):

$$M_x/H_{2x} >> M_{xy}/H_{2xy} \, (\approx 0)$$

$$M_y/H_{2y} >> M_{xy}/H_{2xy} \, (\approx 0) \quad (9)$$

The equation (9) means that the effectual magnetic susceptibilities $\chi_x \, (=M_x/H_{2x})$, $\chi_y \, (=M_y/H_{2y})$ of the ferri-magnetic laminate structure 55 respectively corresponding to the memory cell connected to the non-selected word line and the selected bit line and the memory cell connected to the selected word line and the non-selected bit line are notably larger than the effectual magnetic susceptibility $\chi_{xy} \, (=M_{xy}/H_{2xy})$ of the ferri-magnetic laminate structure 55 corresponding to the selected memory cell.

Since the magnetic field applied to the magneto-resistance element 45 by the ferri-magnetic laminate structure 55 is proportional to the magnitude of the magnetization induced in the ferri-magnetic laminate structure 55, the equation (9) means that the ferri-magnetic laminate structures 55 corresponding to the memory cell connected to the non-selected word line and the selected bit line and the memory cell connected to the selected word line and the non-selected bit line apply the magnetic field which is notably larger than the ferri-magnetic laminate structure 55 corresponding to the selected memory cell to the magneto-resistance element 45.

Figure 24A:
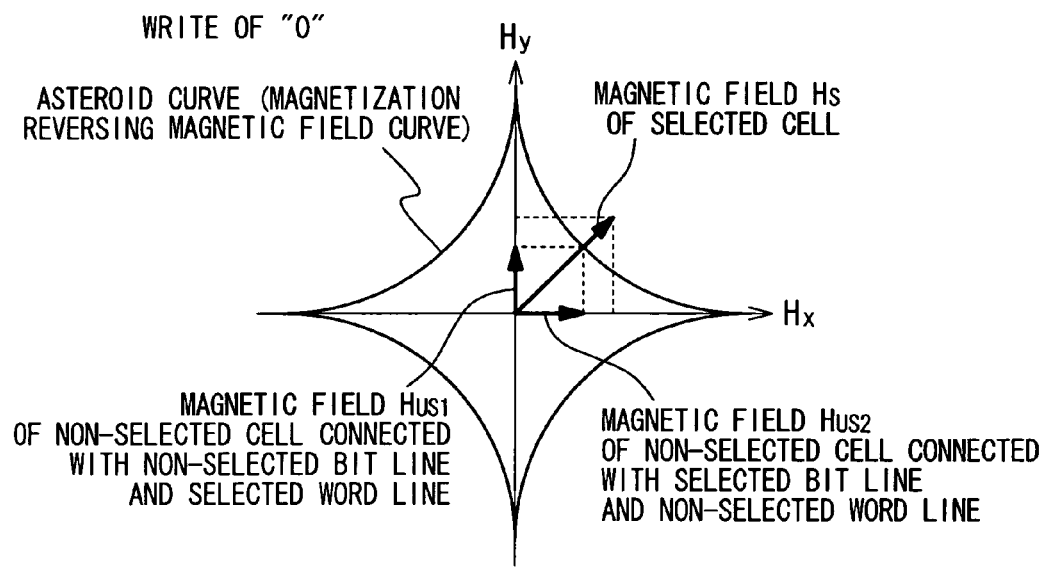
FIG. 24A shows the magnetic field Hs applied to the magneto-resistance element contained in the selected memory cell, the magnetic field $H_{us1}$ applied to the magneto-resistance element contained in the memory cell connected to the selected word line and the non-selected bit line, and the magnetic field $H_{us2}$ applied to the magneto-resistance element contained in the memory cell connected to the non-selected word line and the selected bit line when a write operation of "0" is carried out.

As described above, the magnetic field applied to the magneto-resistance element 45 by the ferri-magnetic laminate structure 55 functions to weaken the magnetic field applied to the magneto-resistance element 45 by the write currents $I_x$ and $I_y$. Therefore, as shown in FIG. 24A, a magnetic field $H_{us1}$ applied to the magneto-resistance element 45 contained in the memory cell connected to the selected word line and the non-selected bit line and a magnetic field $H_{us2}$ applied to the magneto-resistance element 45 contained in the memory cell connected to the non-selected word line and the selected bit line is notably weakened compared with the magnetic field $H_s$ applied to the magneto-resistance element 45 contained in the selected memory cell.

Figure 24B:
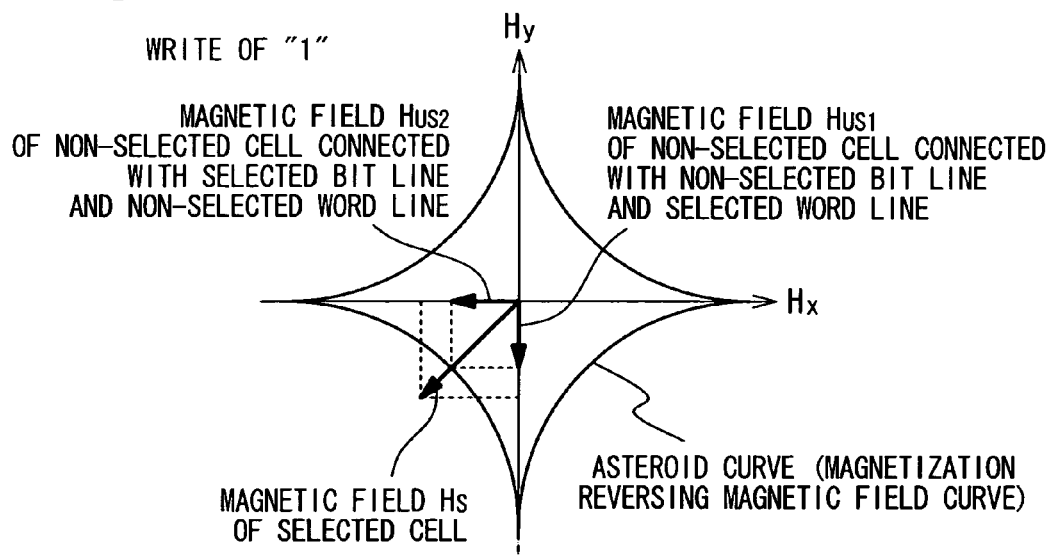
FIG. 24B shows the magnetic field Hs applied to the magneto-resistance element contained in the selected memory cell, the magnetic field $H_{us1}$ applied to the magneto-resistance element contained in the memory cell connected to the selected word line and the non-selected bit line, and the magnetic field $H_{us2}$ applied to the magneto-resistance element contained in the memory cell connected to the non-selected word line and the selected bit line when the write operation of "1" is carried out.

From the same consideration for the case where "0" is written in the selected memory cell as the case where "0" is written in the selected memory cell, as shown in FIG. 24B, it could be understood that the magnetic field $H_{us1}$ applied to the magneto-resistance element 45 contained in the memory cell connected to the selected word line and the non-selected bit line and the magnetic field $H_{us2}$ applied to the magneto-resistance element 45 contained in the memory cell connected to the non-selected word line and the selected bit line is notably weakened compared with the magnetic field $H_s$ applied to the magneto-resistance element 45 contained in the selected memory cell.

As described above, in the third embodiment, the magnetic field $H_{us1}$ applied to the magneto-resistance element 45 contained in the memory cell connected to the selected word line and the non-selected bit line and the magnetic field $H_{us2}$ applied to the magneto-resistance element 45 contained in the memory cell connected to the non-selected word line and the selected bit line is notably weakened compared with the magnetic field $H_s$ applied to the magneto-resistance element 45 contained in the selected memory cell. Thereby, the selectivity of the selected memory cell is effectively improved.

In the third embodiment, it is not required that the direction of synthetic magnetic field $H_{2xy}$ applied to the ferri-magnetic laminate structure 55 corresponding to the selected memory cell is completely coincident with the easy axis direction. The direction of the synthetic magnetic field $H_{2xy}$ can be directed to the middle direction. However, it is required that the direction of the synthetic magnetic field $H_{2xy}$ is closer to the easy axis direction than the directions of the magnetic field $H_{2x}$ and the magnetic field $H_{2y}$. Also, it is required that the synthetic magnetic field $H_{2xy}$ satisfies the following equation (8-3)' instead of the equation (8-3):

$$H_{2xy} < H_{txy} \quad (8\text{-}3)'$$

Herein, $H_{txy}$ is a threshold magnetic field of the ferri-magnetic laminate structure 55 in the direction of the synthetic magnetic field $H_{2xy}$. The equation (8-3)' means that the synthetic magnetic field $H_{2xy}$ is in the non-linear magnetization region, and therefore the magnetization $M_{xy}$ induced in the ferri-magnetic laminate structure 55 corresponding to the selected memory cell is small.

[Fourth Embodiment]

Figure 25:
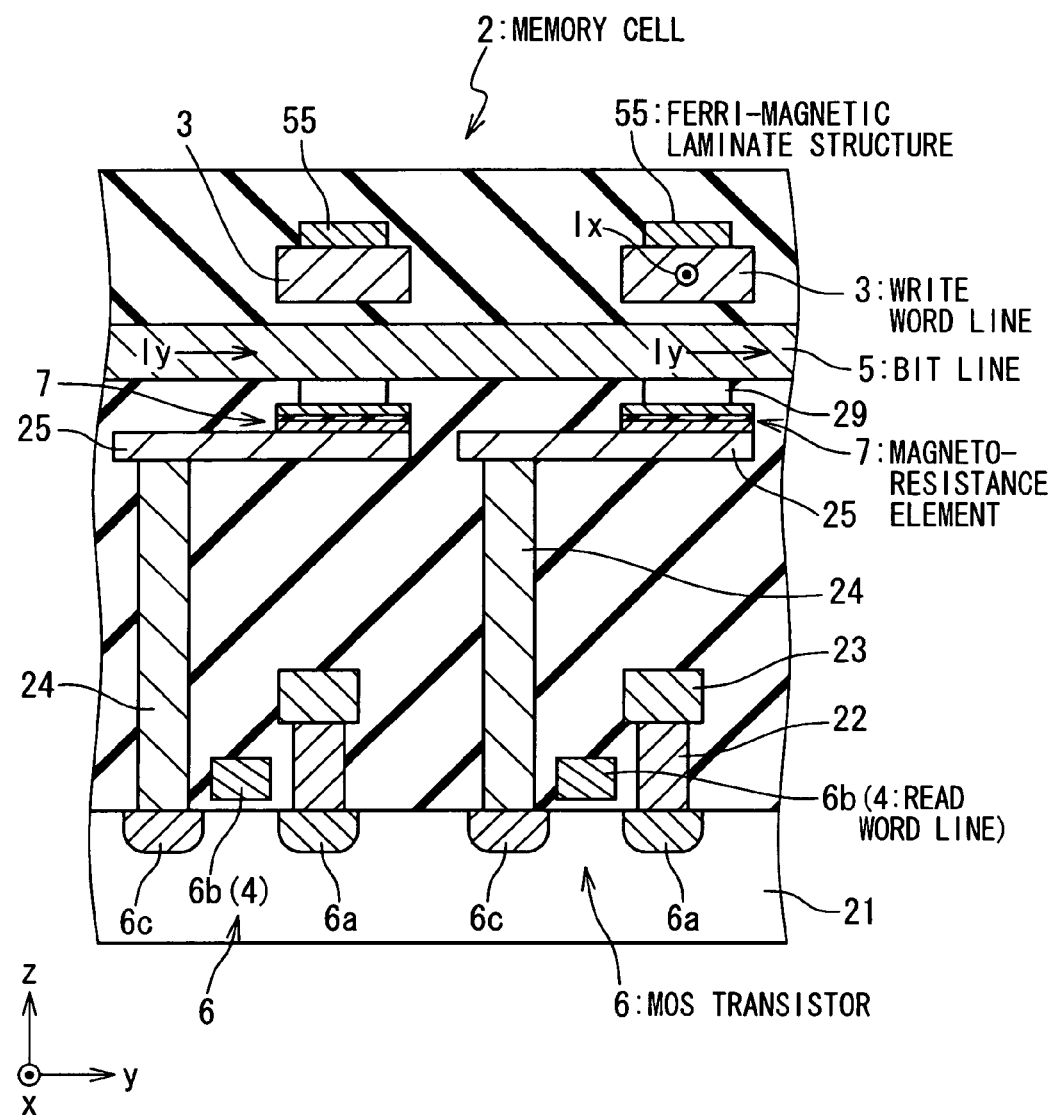
FIG. 25 is a sectional view of the memory cell of the MRAM according to a fourth embodiment of the present invention.

FIG. 25 shows a sectional structure of the MRAM according to the fourth embodiment of the present invention. The MRAM according to the fourth embodiment has a structure in which a MOS transistor 6 is provided for each memory cell 2 in the same manner as the first embodiment, and the circuit configuration of the MRAM according to the fourth embodiment is the same as that of the first embodiment shown in FIG. 4.

Figure 26:
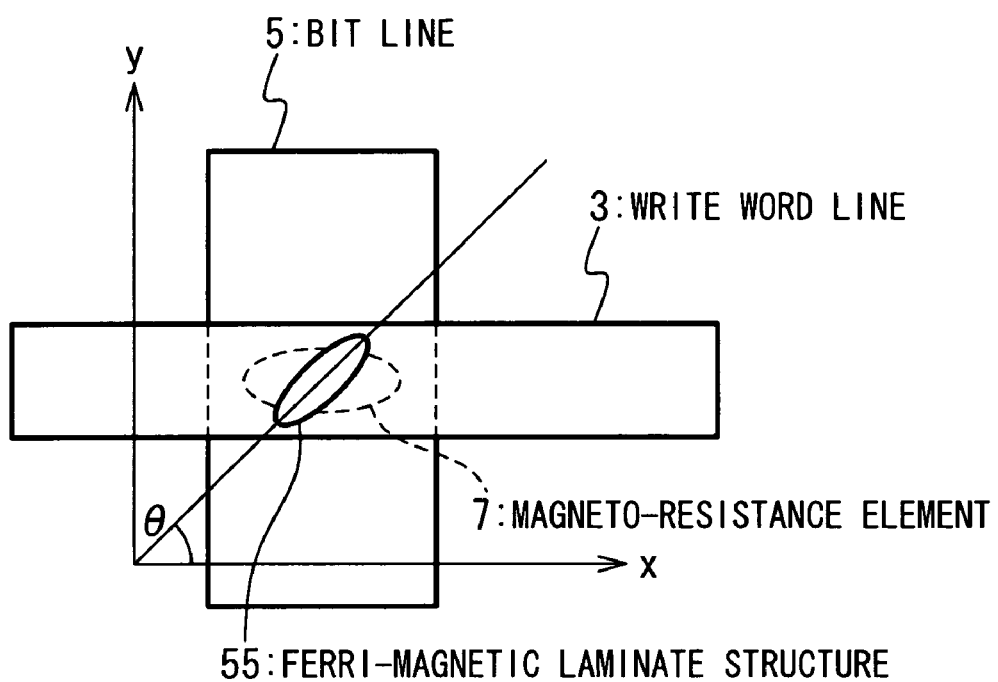
FIG. 26 is a plan view showing the arrangement of the magneto-resistance element and the ferri-magnetic laminate structure in the fourth embodiment.
Figure 28:
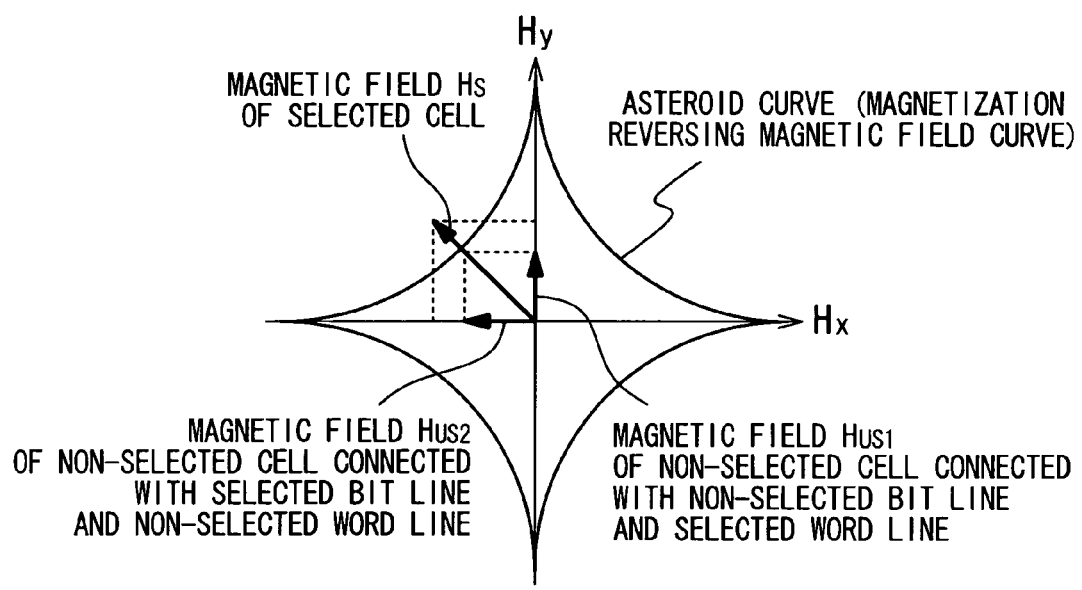
FIG. 28 shows the magnetic field Hs applied to the magneto-resistance element contained in the selected memory cell, the magnetic field $H_{us1}$ applied to the magneto-resistance element contained in the memory cell connected to the selected word line and the non-selected bit line, and the magnetic field $H_{us2}$ applied to the magneto-resistance element contained in the memory cell connected to the non-selected word line and the selected bit line, in the fourth embodiment.

The MRAM according to the fourth embodiment is different from the MRAM according to the first embodiment in that the ferri-magnetic laminate structure 30 of the MRAM according to the first embodiment shown in FIG. 5 is replaced by the ferri-magnetic laminate structure 55 of the second embodiment and the third embodiment. The ferri-magnetic laminate structure 30 of the first embodiment has an isotropic characteristic on an X-Y plane, while the ferri-magnetic laminate structure 55 in the fourth embodiment has a substantial elliptical plane shape, and has an anisotropic characteristic on the X-Y plane, as shown in FIG. 26. The long axis of the ferri-magnetic laminate structure 55 is inclined by the angle θ from the X-axis in the same manner as the third embodiment. Typically, the angle θ is 45 degrees. The easy axis direction and the hard axis direction of the ferri-magnetic laminate structure 55 are also inclined by the angle θ by inclining the ferri-magnetic laminate structure 55 by the angle θ from the X-axis direction. The easy axis direction of the ferri-magnetic laminate structure 55 is a direction of the angle θ with the +X axis direction, and the hard axis direction of the ferri-magnetic laminate structure 55 is a direction of the angle θ with the +Y axis direction.

In the MRAM according to the fourth embodiment, the magnetic field applied to the magneto-resistance element 7 of the selected memory cell is selectively enhanced by using the characteristic of the ferri-magnetic laminate structure 55. Thus, the selectivity of the selected memory cell is improved. Hereinafter, the detail will be described.

The data of the MRAM according to the fourth embodiment is written by flowing the write current $I_x$ through the selected write word line and by flowing the write current $I_y$ through the selected bit line in the same manner as the first embodiment. The magnetic field is applied to the magneto-resistance element 7 contained in the selected memory cell, the memory cell connected to the selected word line and the non-selected bit line and the memory cell connected to the non-selected word line and the selected bit line by flowing the write current $I_x$ and the write current $I_y$. By flowing the write current $I_x$ and the write current $I_y$, the magnetic field is applied to the ferri-magnetic laminate structure 55, and the magnetization is induced. In the MRAM according to the fourth embodiment, in the same manner as the first embodiment, the write word line 3 and the bit line 5 are located between the ferri-magnetic laminate structure 55 and the magneto-resistance element 7. Thereby, the magnetization induced in the ferri-magnetic laminate structure 55 plays a role in enhancing the magnetic field applied to the magneto-resistance element 7.

FIG. 27A shows the synthetic magnetic field $H_{2xy}$ applied to the ferri-magnetic laminate structure 55 corresponding to the selected memory cell, FIG. 27B shows the magnetic field $H_{2x}$ applied to the ferri-magnetic laminate structure 55 corresponding to the memory cell connected to the non-selected word line and the selected bit line, and FIG. 27C shows the magnetic field $H_{2y}$ applied to the ferri-magnetic laminate structure 55 corresponding to the memory cell connected to the non-selected word line and the selected bit line. The synthetic magnetic field $H_{2xy}$ is the synthetic magnetic field of the magnetic field $H_{2x}$ and magnetic field $H_{2y}$.

As shown in FIG. 27A, the magnitudes of the write current $I_x$ and the write current $I_y$ are determined such that the synthetic magnetic field $H_{2xy}$ applied to the ferri-magnetic laminate structure 55 corresponding to the selected memory cell is substantially coincident with the hard axis direction of the ferri-magnetic laminate structure 55. Since the threshold magnetic field $H_t$ is 0 in the hard axis direction, the synthetic magnetic field $H_{2xy}$ is in the linear magnetization region. The ferri-magnetic laminate structure 55 corresponding to the selected memory cell shows a magnetization-magnetic field characteristic shown in FIG. 17A, and the relatively large magnetization $M_{xy}$ is induced by the synthetic magnetic field $H_{2xy}$ in the ferri-magnetic laminate structure 55 corresponding to the selected memory cell.

The magnitudes of the write current $I_x$ and the write current $I_y$ are selected such that the magnetic field $H_{2x}$ applied to the ferri-magnetic laminate structure 55 corresponding to the memory cell connected to the non-selected word line and the selected bit line and magnetic field $H_{2y}$ applied to the ferri-magnetic laminate structure 55 corresponding to the memory cell connected to the non-selected word line and the selected bit line satisfy the following conditions (10-1) and (10-2):

$$H_{2x} < H_{tx} \qquad (10\text{-}1)$$

$$H_{2y} < H_{ty} \qquad (10\text{-}2)$$

Herein, $H_{tx}$ is a threshold for the direction (middle direction) of the magnetic field $H_{2x}$, and $H_{ty}$ is a threshold for the direction (middle direction) of the magnetic field $H_{2y}$.

According to the equation (10-1), the magnetic field $H_{2x}$ which is smaller than the threshold magnetic field $H_{tx}$ is applied to the ferri-magnetic laminate structure 55 corresponding to the memory cell connected to the non-selected word line and the selected bit line in the middle direction. That is, as shown in FIG. 27B, the magnetic field $H_{2x}$ is in the non-linear magnetization region. Therefore, the magnetization $M_x$ induced in the ferri-magnetic laminate structure 55 corresponding to the memory cell connected to the non-selected word line and the selected bit line is extremely small as shown in FIG. 17C.

Similarly, according to the equation (10-2), the magnetic field $H_{2y}$ which is smaller than the threshold magnetic field $H_{ty}$ is applied to the ferri-magnetic laminate structure 55 corresponding to the memory cell connected to the selected word line and the non-selected bit line in the middle direction. That is, as shown in FIG. 27C, the magnetic field $H_{2y}$ is in the non-linear magnetization region. Therefore, the magnetization $M_y$ induced in the ferri-magnetic laminate structure 55 corresponding to the memory cell connected to the selected word line and the non-selected bit line is extremely small as shown in FIG. 17C.

From the above consideration, it could be understood that the following equation (11) is satisfied by satisfying the equations (10-1) and (10-2):

$$M_{xy}/H_{2xy} >> M_x/H_{2x} \ (\approx 0)$$

$$M_{xy}/H_{2xy} >> M_y/H_{2y} \ (\approx 0) \qquad (11)$$

The equation (11) means that the effectual magnetic susceptibility $\chi_{xy} (= M_{xy}/H_{2xy})$ of the ferri-magnetic laminate structure 55 corresponding to the selected memory cell is notably larger than the effectual magnetic susceptibilities $\chi_x$ $(= M_x/H_{2x})$ and $\chi_y (= M_y/H_{2y})$ of the ferri-magnetic laminate structure 55 corresponding to each of the memory cell connected to the non-selected word line and the selected bit line and the memory cell connected to the selected word line and the non-selected bit line.

Since the magnetic field applied to the magneto-resistance element 7 by the ferri-magnetic laminate structure 55 is proportional to the magnitude of the magnetization induced in the ferri-magnetic laminate structure 55, the equation (11) means that the ferri-magnetic laminate structure 55 corresponding to the selected memory cell applies the magnetic field which is notably larger than the ferri-magnetic laminate structures 55 respectively corresponding to the memory cell connected to the non-selected word line and the selected bit line and the memory cell connected to the selected word line and the non-selected bit line to the magneto-resistance element 7.

As described above, the magnetic field applied to the magneto-resistance element 7 by the ferri-magnetic laminate structure 55 is generated to enhance the magnetic field applied to the magneto-resistance element 7 by the write currents $I_x$ and $I_y$. Therefore, as shown in FIGS. 27A to 27C, the magnetic field $H_s$ applied to the magneto-resistance element 7 contained in the selected memory cell is notably enhanced compared with the magnetic field $H_{us1}$ applied to the magneto-resistance element 7 contained in the memory cell connected to the selected word line and the non-selected bit line and the magnetic field $H_{us2}$ applied to the magneto-resistance element 7 contained in the memory cell connected to the non-selected word line and the selected bit line. Thereby, the selectivity of the selected memory cell is effectively improved.

In the conventional MRAM described in Japanese Laid Open Patent Application (JP-P2002-110938A), a word line or a bit line is surrounded except one plane by a magnetic film containing at least one of a highly saturated magnetized soft magnetic material containing cobalt, and a metal-non-metal nanogranular film. The conventional MRAM aims at only strengthening the magnetic field. It is described that when a 3-layer film formed of a ferromagnetic layer/non-magnetic layer/ferromagnetic layer is used instead of the above magnetic film, the anti-ferromagnetical interaction acts through the non-magnetic layer between the ferromagnetic layers. However, the detailed description for the structure and the operation is not carried out. It seems that the 3-layer film is formed such that the word line or the bit line is surrounded except one plane. A treatment method of the threshold of the magnetization of the 3-layer film and a relation of the magnitude of the magnetization are not discussed. In the present invention, the technique for improving the selectivity of the selected memory cell and stabilizing the write operation in the MRAM is provided by considering them.

The invention claimed is:

1. A magnetic random access memory comprising:
a plurality of first signal lines provided to extend in a first direction;
a plurality of second signal lines provided to extend in a second direction substantially perpendicular to said first direction;
a plurality of memory cells respectively provided at intersections of said plurality of first signal lines and said plurality of second signal lines; and
a plurality of magnetic structures respectively provided for said plurality of memory cells,
wherein each of said plurality of memory cells comprises a magneto-resistance element containing a spontaneous magnetization layer which has a first threshold function, and a direction of a spontaneous magnetization of said spontaneous magnetization layer is reversible when an element applied magnetic field equal to or larger than a value of the first threshold function is applied,
each of said plurality of magnetic structures has a second threshold function, and generates a magnetic structure magnetic field in response to a structure applied magnetic field, and generates a first structure magnetic field as said magnetic structure magnetic field when said structure applied magnetic field is equal to or larger than a value of a second threshold function, and a second structure magnetic field, which is weaker than said first structure magnetic field, as said magnetic structure magnetic field, when said structure applied magnetic field is less than the second threshold function value,
a first write current is supplied to one of said plurality of first signal lines as a first selected signal line such that a first magnetic field is generated, a second write current is supplied to one of said plurality of second signal lines as a second selected signal line such that a second magnetic field is generated, and a first synthetic magnetic field of said first magnetic field and said second magnetic field is applied to said plurality of magnetic structures as said structure applied magnetic field, and
a second synthetic magnetic field of said first synthetic magnetic field and said magnetic structure magnetic field is generated as said element applied magnetic field such that said element applied magnetic field equal to or larger than the first threshold function value is applied to a selected memory cell as one of said plurality of memory cells which is provided at the intersection of said first selected signal line and said second selected signal line, and such that said element applied magnetic field less than the first threshold function value is applied to each of non-selected memory cells as ones said plurality of memory cells other than said selected memory cell.

2. The magnetic random access memory according to claim 1, wherein each of said plurality of magnetic structures comprises:
a first magnetic layer formed of ferromagnetic material;
a second magnetic layer formed of ferromagnetic material; and
a non-magnetic layer interposed between said first magnetic layer and said second magnetic layer.

3. The magnetic random access memory according to claim 1, wherein said non-magnetic layer has a film thickness such that said first magnetic layer is anti-ferromagnetically coupled to said second magnetic layer.

4. The magnetic random access memory according to claim 3, wherein the second threshold function is determined based on the film thickness of said non-magnetic layer.

5. The magnetic random access memory according to claim 2, wherein when said structure applied magnetic field is not applied, said magnetic structure magnetic field generated by said magnetic structure is substantially 0.

6. The magnetic random access memory according to claim 1, wherein when said first write current is supplied to said first selected signal line and said second write current is supplied to f said second selected signal line, said first synthetic magnetic field larger than the second threshold function value is applied as said structure applied magnetic field to said magnetic structure corresponding to said selected memory cell, and said magnetic structure corresponding to said selected memory cell generates said first structure magnetic field as said magnetic structure magnetic field, such that said second synthetic magnetic field of said first synthetic magnetic field and said first structure magnetic field is applied to said magneto-resistance element of said selected memory cell as said element applied magnetic field equal to or larger than the first threshold function value, and said first synthetic magnetic field having the intensity less than the second threshold function value is applied as said structure applied magnetic field to said magnetic structure corresponding to each of said non-selected memory cells, and said magnetic structure corresponding to said non-selected memory cell generates said second structure magnetic field as the magnetic structure magnetic field, such that said second synthetic magnetic field of said first synthetic magnetic field and said second structure magnetic field is applied to said magneto-resistance element of said selected memory cell as said element applied magnetic field less than the first threshold function value.

7. The magnetic random access memory according to claim 1, wherein when said first write current is supplied to said first selected signal line and said second write current is supplied to f said second selected signal line, said first synthetic magnetic field less than the second threshold function value is applied as said structure applied magnetic field to said magnetic structure corresponding to said selected memory cell, and said magnetic structure corresponding to said selected memory cell generates said second structure magnetic field as said magnetic structure magnetic field, such that said synthetic magnetic field of said first synthetic magnetic field and said second structure magnetic field is applied to said magneto-resistance element of said selected memory cell as said element applied magnetic field equal to or larger than the first threshold function value, and said first synthetic magnetic field having the intensity equal to or larger than the second threshold function value is applied as said structure applied magnetic field to said magnetic structure corresponding to each of said non-selected memory cells, and said magnetic structure corresponding to said non-selected memory cell generates said first structure magnetic field as said magnetic structure magnetic field, such that said synthetic magnetic field of said first synthetic magnetic field and said first structure magnetic field is applied to said magneto-resistance element of said selected memory cell as said element applied magnetic field less than the first threshold function value.

8. The magnetic random access memory according to claim 6, wherein one of said plurality of first signal lines and one of said plurality of second signal lines are provided between a corresponding one of said plurality of memory cells and said magnetic structure corresponding to the corresponding memory cell, and said corresponding magnetic structure is provided directly or indirectly on said first signal line.

9. The magnetic random access memory according to claim 7, wherein each of said plurality of memory cells and said magnetic structure corresponding to said memory cell and provided above or below said memory cell are provided between one of said plurality of first signal lines corresponding to said memory cell and one of said plurality of second signal lines corresponding to said memory cell.

10. The magnetic random access memory according to claim 6, wherein said magnetic structure has a circular plane structure.

11. The magnetic random access memory according to claim 6, wherein said magnetic structure has an elliptical plane structure.

12. The magnetic random access memory according to claim 11, wherein an elliptical long axis of said magnetic structure is directed into a direction other than the first direction and the second direction.

13. The magnetic random access memory according to claim 12, wherein the elliptical long axis of said magnetic structure is directed to the direction of 45 degrees from each of the first direction and the second direction.

14. A magnetic random access memory comprising:
a plurality of first signal lines provided to extend in a first direction;
a plurality of second signal lines provided to extend in a second direction substantially perpendicular to the first direction;
a plurality of memory cells, each of which contains a magneto-resistance element having a spontaneous magnetization whose direction is reversible based on data to be stored, and which are respectively provided at intersections of said plurality of first signal lines and said plurality of second signal lines; and
a plurality of magnetic structures which are provided for said plurality of memory cells, and each of which applies a magnetic field to said magneto-resistance element contained in a corresponding one of said plurality of memory cells based on induced magnetization,
wherein one of said plurality of memory cells provided for the intersection of a first selected signal line selected from among said plurality of first signal lines and a second selected signal line from among said plurality of second signal lines is a selected memory cell,
one of said plurality of magnetic structures corresponding to said selected memory cell is a selected magnetic structure,
one of said plurality of memory cells which is other than said selected memory cell and which intersects said first selected signal line is a first non-selected memory cells,
one of said plurality of magnetic structures corresponding to said first non-selected memory cell is a first non-selected magnetic structure,
a synthetic magnetic field $H_{xy}$ applied to said selected magnetic structure by a first write current flowing through said first selected signal line in a write operation and a second write current flowing through said second selected signal line in the write operation, said magnetization $M_{xy}$ induced in said selected magnetic structure by said synthetic magnetic field $H_{xy}$, a magnetic field $H_y$ applied to each of said first non-selected magnetic structures by said first write current in the write operation, and a magnetization $M_y$ induced in said first non-selected magnetic structure by said magnetic field $H_y$ satisfy the following relation:

$$M_{xy}/H_{xy} \neq M_y/H_y.$$

15. The magnetic random access memory according to claim 14, wherein one of said plurality of memory cells which is other than said selected memory cell and which intersects said second selected signal line is a second non-selected memory cell, and
one of said plurality of magnetic structures corresponding to said second non-selected memory cell is a second non-selected magnetic structure, said synthetic magnetic field $H_{xy}$, said magnetization $M_{xy}$, a magnetic field $H_x$ applied to said second non-selected magnetic structure by said second write current in the write operation, and a magnetization $M_x$ induced in said second non-selected magnetic structure by said magnetic field $H_x$ satisfy the following relation:

$$M_{xy}/H_{xy} \neq M_x/H_x.$$

16. The magnetic random access memory according to claim 14, wherein said plurality of magnetic structures are arranged in positions where said magnetization $M_{xy}$ and said magnetization $M_y$ are induced such that a magnetic field applied to said magneto-resistance element contained in said selected memory cell by said first write current and said second write current and a magnetic field applied to said magneto-resistance element contained in said first non-selected memory cell by said first write current are enhanced, and said magnetic field $H_y$, said synthetic magnetic field $H_{xy}$, said magnetization $M_y$ and said magnetization $M_{xy}$ satisfy $$M_{xy}/H_{xy} > M_y/H_y.$$

17. The magnetic random access memory according to claim 14, wherein said plurality of first signal lines and said plurality of second signal lines are located between said plurality of magnetic structures and said plurality of memory cells, and said magnetic field $H_y$, said synthetic magnetic field $H_{xy}$, said magnetization $M_y$ and said magnetization $M_{xy}$ satisfy $$M_{xy}/H_{xy} > M_y/H_y.$$

18. The magnetic random access memory according to claim 17, wherein one of said plurality of memory cells which is other than said selected memory cell and which intersects said second selected signal line is a second non-selected memory cell, one of said plurality of magnetic structures corresponding to said second non-selected memory cell is a second non-selected magnetic structure, and said synthetic magnetic field $H_{xy}$, said magnetization $M_{xy}$, said magnetic field $H_x$ applied to said second non-selected magnetic structure by said second write current in the write operation, and said magnetization $M_x$ induced in said second non-selected magnetic structure by said magnetic field $H_x$ satisfy $$M_{xy}/H_{xy} > M_x/H_x.$$

19. The magnetic random access memory according to claim 14, wherein said plurality of magnetic structures are arranged in positions where said magnetization $M_{xy}$ and said magnetization $M_y$ are induced such that a magnetic field applied to said magneto-resistance element contained in said selected memory cell by said first write current and said second write current and a magnetic field applied to said magneto-resistance element contained in said first non-selected memory cell by said first write current are weakened, and said magnetic field $H_y$, said synthetic magnetic field $H_{xy}$, said magnetization $M_y$, and said magnetization $M_{xy}$ satisfy $$M_{xy}/H_{xy} < M_y/H_y.$$

20. The magnetic random access memory according to claim 14, wherein said plurality of magnetic structures and said plurality of memory cells are located between said plurality of first signal lines and said plurality of second signal lines, and said magnetic field $H_y$, said synthetic magnetic field $H_{xy}$, said magnetization $M_y$ and said magnetization $M_{xy}$ satisfy $$M_{xy}/H_{xy} < M_y/H_y.$$

21. The magnetic random access memory according to claim 20, wherein one of said plurality of memory cells which is other than said selected memory cell and which intersects said second selected signal line is a second non-selected memory cell, one of said plurality of magnetic structures corresponding to said second non-selected memory cell is a second non-selected magnetic structure, and said synthetic magnetic field $H_{xy}$, said magnetization $M_{xy}$, said magnetic field $H_x$ applied to said second non-selected magnetic structure by said second write current in the write operation, and said magnetization $M_x$ induced in said second non-selected magnetic structure satisfy $$M_{xy}/H_{xy} < M_x/H_x.$$

22. The magnetic random access memory according to claim 14, wherein each of said plurality of magnetic structures comprises a ferri-magnetic laminate structure comprises:

a first magnetic layer formed of ferromagnetic material;

a second magnetic layer formed of ferromagnetic material; and a non-magnetic layer interposed between said first magnetic layer and said second magnetic layer and having a film thickness such that said first magnetic layer is anti-ferromagnetically coupled to said second magnetic layer.

23. The magnetic random access memory according to claim 16, wherein each of said plurality of magnetic structures comprises a ferri-magnetic laminate structure comprises:

a first magnetic layer formed of ferromagnetic material;

a second magnetic layer formed of ferromagnetic material; and a non-magnetic layer interposed between said first magnetic layer and said second magnetic layer, and having a film thickness such that said first magnetic layer is anti-ferromagnetically coupled to said second magnetic layer, said synthetic magnetic field $H_{xy}$ is larger than a threshold magnetic field $H_{txy}$ of said ferri-magnetic laminate structure in a direction of said synthetic magnetic field $H_{xy}$, and said magnetic field $H_y$ is smaller than a threshold magnetic field $H_{ty}$ of said ferri-magnetic laminate structure in a direction of a magnetic field $H_y$.

24. The magnetic random access memory according to claim 18, wherein each of said plurality of magnetic structures comprises a ferri-magnetic laminate structure comprises:

a first magnetic layer formed of ferromagnetic material;

a second magnetic layer formed of ferromagnetic material; and a non-magnetic layer interposed between said first magnetic layer and said second magnetic layer and having a film thickness such that said first magnetic layer is anti-ferromagnetically coupled to said second magnetic layer, said synthetic magnetic field $H_{xy}$ is larger than a threshold magnetic field $H_{fxy}$ of said ferri-magnetic laminate structure in a direction of said synthetic magnetic field $H_{xy}$, said magnetic field $H_x$ is smaller than a threshold magnetic field $H_{fx}$ of said ferri-magnetic laminate structure in a direction of said magnetic field $H_x$, and said magnetic field $H_y$ is smaller than a threshold magnetic field $H_{fy}$ of said ferri-magnetic laminate structure in a direction of said magnetic field $H_y$.

25. The magnetic random access memory according to claim 24, wherein anisotropy is given to said magneto-resistance element such that the direction of said spontaneous magnetization of said magneto-resistance element is substantially coincident with the first direction, and to said ferri-magnetic laminate structure such that directions of spontaneous magnetizations of said first magnetic layer and said second magnetic layer are directed into a third direction which is not perpendicular to the first direction.

26. The magnetic random access memory according to claim 24, wherein an angle between the first direction and the third direction is substantially 45 degrees.

27. The magnetic random access memory according to claim 25, wherein the direction of said synthetic magnetic field $H_{xy}$ is substantially perpendicular to the third direction.

28. The magnetic random access memory according to claim 19, wherein each of said plurality of magnetic structures comprises a ferri-magnetic laminate structure comprises:

a first magnetic layer formed of ferromagnetic material;
a second magnetic layer formed of ferromagnetic material; and
a non-magnetic layer interposed between said first magnetic layer and said second magnetic layer and having a film thickness such that said first magnetic layer is anti-ferromagnetically coupled to said second magnetic layer, said synthetic magnetic field $H_{xy}$ is smaller than a threshold magnetic field $H_{fxy}$ of said ferri-magnetic laminate structure in a direction of said synthetic magnetic field $H_{xy}$, and said magnetic field $H_y$ is larger than a threshold magnetic field $H_{fy}$ of said ferri-magnetic laminate structure in a direction of the magnetic field $H_y$.

29. The magnetic random access memory according to claim 28, wherein anisotropy is given to said magneto-resistance element such that the direction of the spontaneous magnetization of said magneto-resistance element is substantially coincident with the first direction, and to said ferri-magnetic laminate structure such that directions of spontaneous magnetizations of said first magnetic layer and said second magnetic layer are substantially coincident with the first direction.

30. The magnetic random access memory according to claim 21, wherein each of said plurality of magnetic structures comprises a ferri-magnetic laminate structure comprises:

a first magnetic layer formed of ferromagnetic material;
a second magnetic layer formed of ferromagnetic material; and
a non-magnetic layer interposed between said first magnetic layer and said second magnetic layer and having a film thickness such that said first magnetic layer is anti-ferromagnetically coupled to said second magnetic layer, said synthetic magnetic field $H_{xy}$ is smaller than a threshold magnetic field $H_{fxy}$ of said ferri-magnetic laminate structure in a direction of said synthetic magnetic field $H_{xy}$, said magnetic field $H_x$ is larger than a threshold magnetic field $H_{fx}$ of said ferri-magnetic laminate structure in a direction of said magnetic field $H_x$ and said magnetic field $H_y$ is larger than a threshold magnetic field $H_{fy}$ of said ferri-magnetic laminate structure in a direction of said magnetic field $H_y$.

31. The magnetic random access memory according to claim 30, wherein anisotropy is given to said magneto-resistance element such that a direction of the spontaneous magnetization of said magneto-resistance element is substantially coincident with the first direction, and to said ferri-magnetic laminate structure such that directions of spontaneous magnetizations of said first magnetic layer and said second magnetic layer are directed into a third direction which is not perpendicular to the first direction.

32. The magnetic random access memory according to claim 21, wherein the direction of said synthetic magnetic field $H_{xy}$ is substantially identical to the third direction.

* * * * *